United States Patent
Vellianitis et al.

(10) Patent No.: US 11,227,933 B2
(45) Date of Patent: Jan. 18, 2022

(54) FERROELECTRIC FIELD EFFECT TRANSISTOR USING CHARGE TRAPPING BAND MISALIGNMENT AND METHODS OF FORMING THE SAME

(71) Applicant: Taiwan Semiconductor Manufacturing Company Limited, Hsinchu (TW)

(72) Inventors: Georgios Vellianitis, Heverlee (BE); Marcus Johannes Henricus van Dal, Linden (BE)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 21 days.

(21) Appl. No.: 16/835,521

(22) Filed: Mar. 31, 2020

(65) Prior Publication Data
US 2021/0305397 A1    Sep. 30, 2021

(51) Int. Cl.
  *H01L 29/66*    (2006.01)
  *H01L 29/51*    (2006.01)
  (Continued)

(52) U.S. Cl.
  CPC ...... *H01L 29/513* (2013.01); *H01L 29/40111* (2019.08); *H01L 29/516* (2013.01);
  (Continued)

(58) Field of Classification Search
  CPC ............ H01L 29/513; H01L 29/78391; H01L 29/516; H01L 29/6684; H01L 29/517; H01L 29/40111
  (Continued)

(56) References Cited

U.S. PATENT DOCUMENTS

2007/0029616 A1* 2/2007 Choi ................... H01L 27/1052
                                                                        257/365
2010/0276757 A1* 11/2010 Doyle ............... H01L 29/66545
                                                                        257/368
(Continued)

FOREIGN PATENT DOCUMENTS

DE    112017007888 T5    5/2020
JP       2001344836 A    12/2001
(Continued)

OTHER PUBLICATIONS

German Patent and Trademark Office, Application No. 102020110238.0, Office Action dated Nov. 3, 2020, 12 pages.
(Continued)

*Primary Examiner* — Sheikh Maruf
(74) *Attorney, Agent, or Firm* — The Marbury Law Group, PLLC

(57) ABSTRACT

A ferroelectric field effect transistor includes a semiconductor substrate that contains a semiconductor channel that extends between a source region and a drain region. A ferroelectric gate dielectric layer is disposed over the semiconductor channel, and includes a ferroelectric material having a charge trapping band including electronic states generated by interfacial traps of the ferroelectric material. A gate electrode is located on the ferroelectric gate dielectric layer, and is configured to provide an on-state and an off-state for the ferroelectric field effect transistor through application of an on-voltage and an off-voltage, respectively, from a gate bias circuit. An energy level of the charge trapping band during the on-state is offset from an energy level of minority charge carriers of the semiconductor channel. Charge trapping in the ferroelectric material is avoided during operation of the ferroelectric field effect transistor,
(Continued)

thereby increasing the endurance of the ferroelectric field effect transistor.

12 Claims, 20 Drawing Sheets

(51) Int. Cl.
  *H01L 21/28* (2006.01)
  *H01L 29/78* (2006.01)
(52) U.S. Cl.
  CPC ........ *H01L 29/517* (2013.01); *H01L 29/6684* (2013.01); *H01L 29/78391* (2014.09)
(58) Field of Classification Search
  USPC ........................................................ 257/295
  See application file for complete search history.

(56) References Cited

U.S. PATENT DOCUMENTS

| | | | | |
|---|---|---|---|---|
| 2013/0270619 A1* | 10/2013 | Schloesser | ........ | H01L 29/40111 257/295 |
| 2016/0064228 A1* | 3/2016 | van Bentum | ..... | H01L 27/11592 257/295 |
| 2016/0099354 A1* | 4/2016 | Ramaswamy | ........ | H01L 29/513 257/295 |
| 2017/0309488 A1* | 10/2017 | Sakai | .................. | H01L 29/6684 |
| 2018/0366476 A1* | 12/2018 | Liu | ..................... | H01L 21/0228 |
| 2019/0057860 A1* | 2/2019 | Yoon | .................. | H01L 21/3115 |
| 2019/0057971 A1* | 2/2019 | Tsukamoto | ....... | H01L 21/02189 |
| 2019/0115354 A1* | 4/2019 | Tan | ..................... | H01L 27/1159 |
| 2019/0131382 A1* | 5/2019 | Lu | ......................... | H01L 29/785 |
| 2020/0006359 A1* | 1/2020 | Wu | .................. | H01L 29/78391 |
| 2020/0176610 A1* | 6/2020 | Lee | ....................... | H01L 29/786 |

FOREIGN PATENT DOCUMENTS

| | | |
|---|---|---|
| KR | 20130007816 A | 1/2013 |
| KR | 20140111921 A | 9/2014 |
| KR | 20190008048 A | 1/2019 |

OTHER PUBLICATIONS

Korean Patent and Trademark Office, Application No. 1020200082172 .Office Action dated Aug. 30, 2021, 9 pages.

* cited by examiner

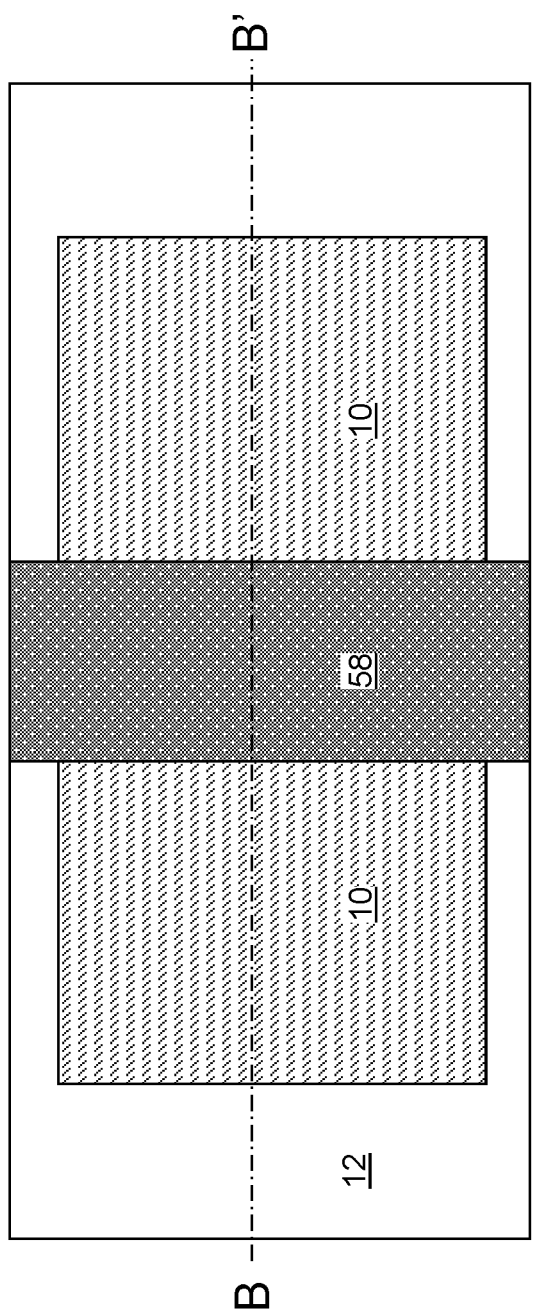
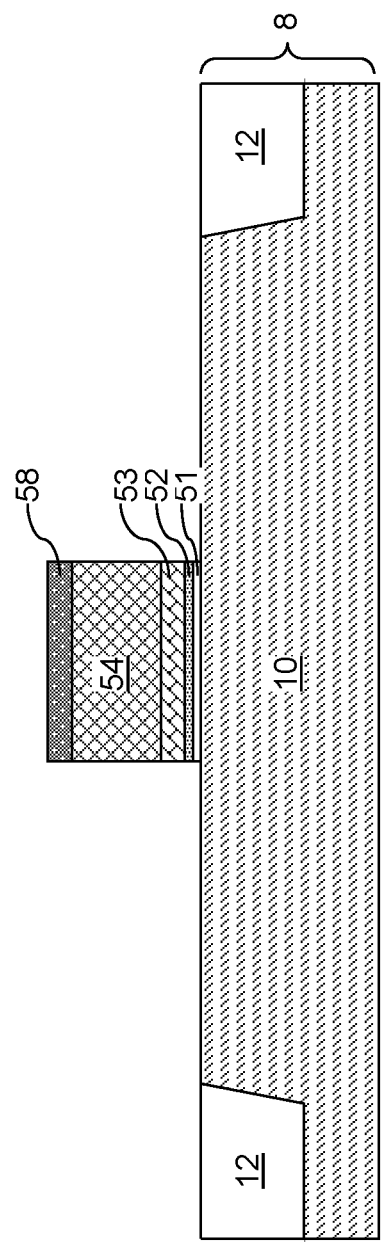

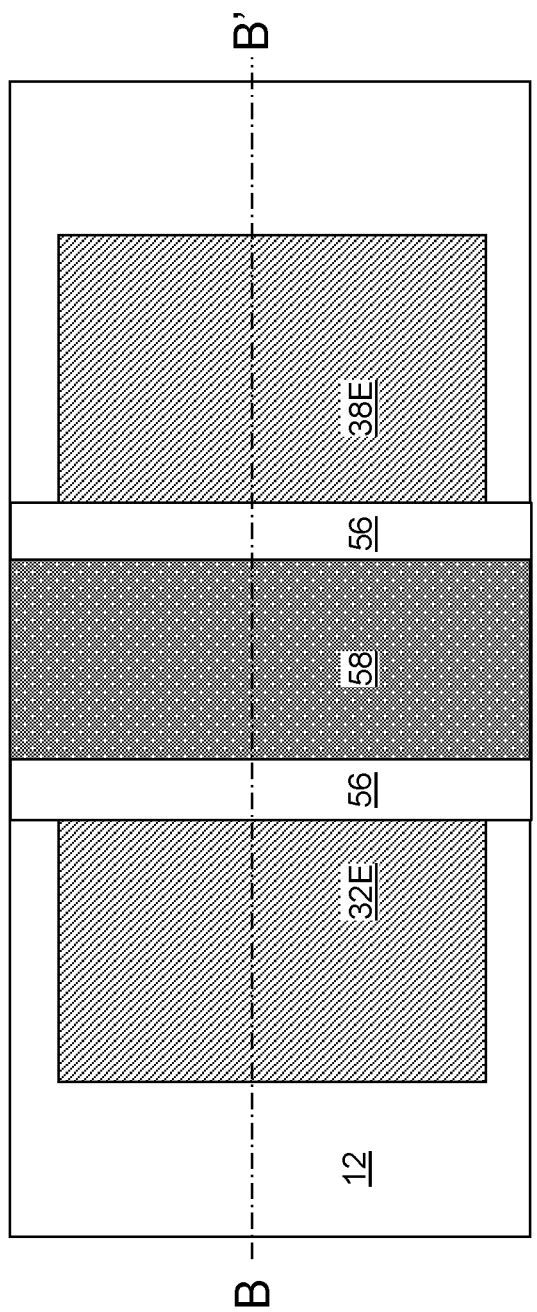
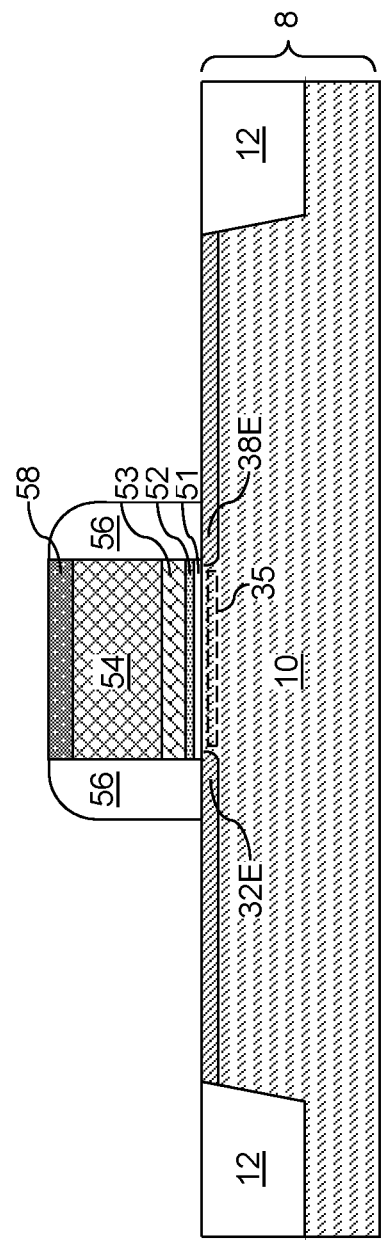
FIG. 4A
FIG. 4B

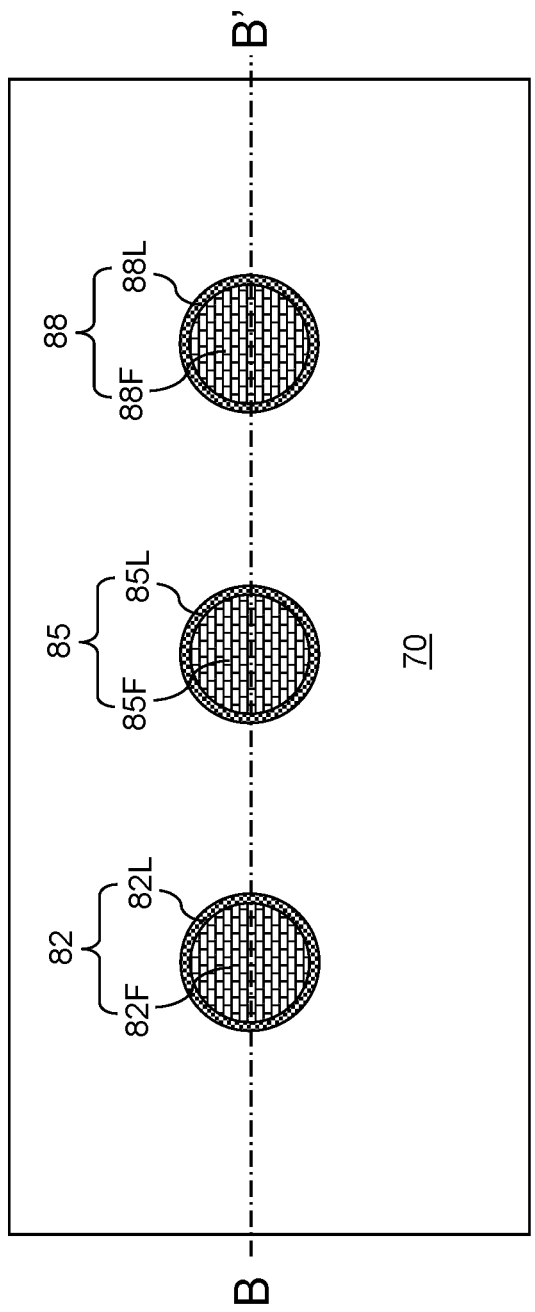
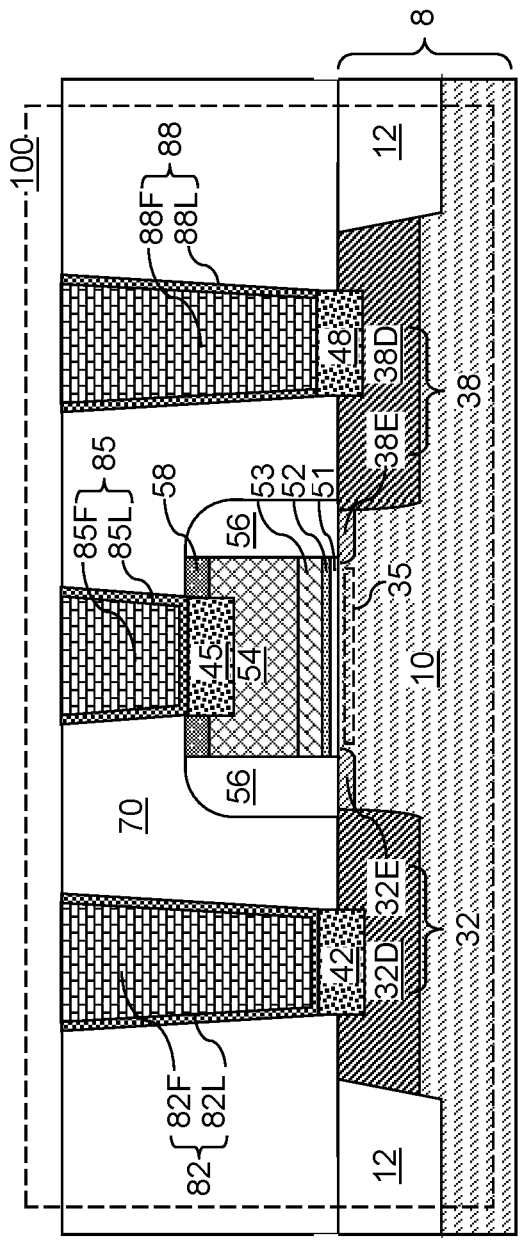

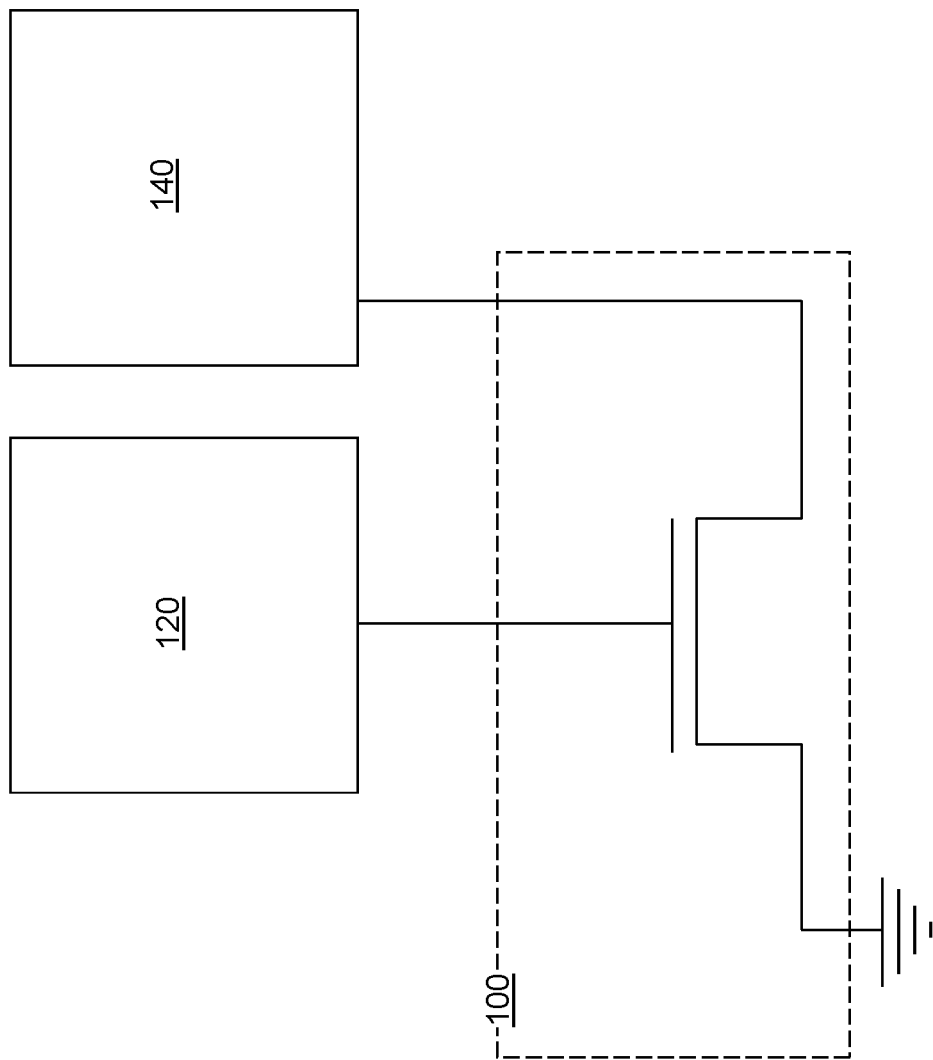

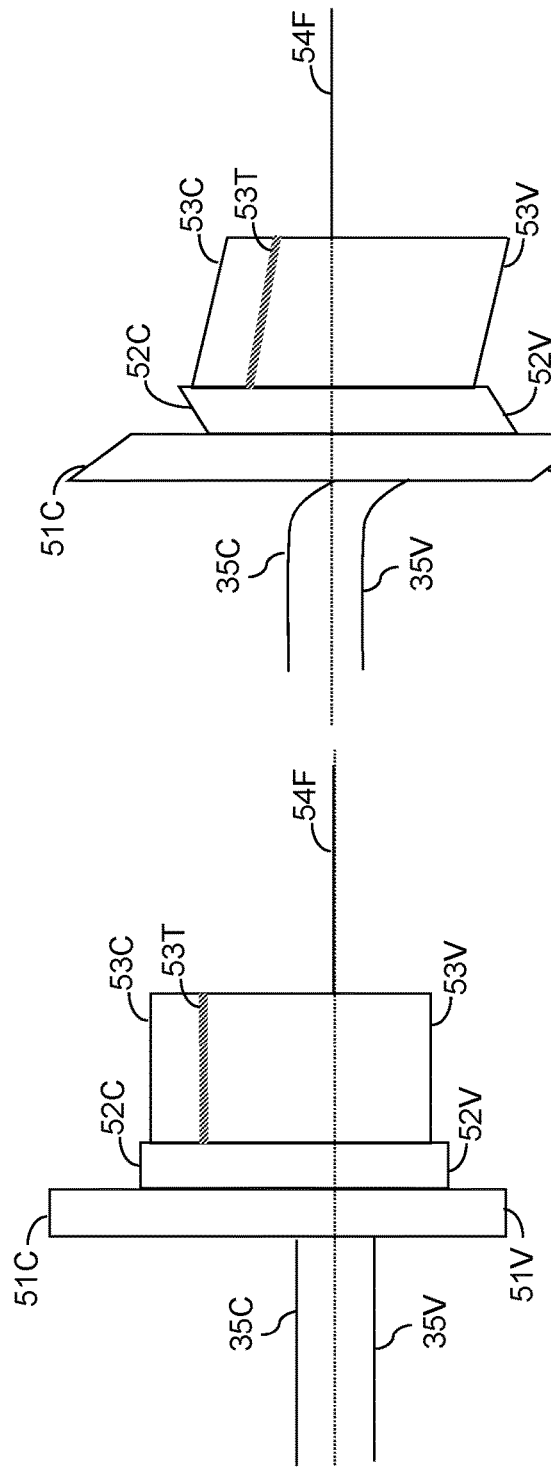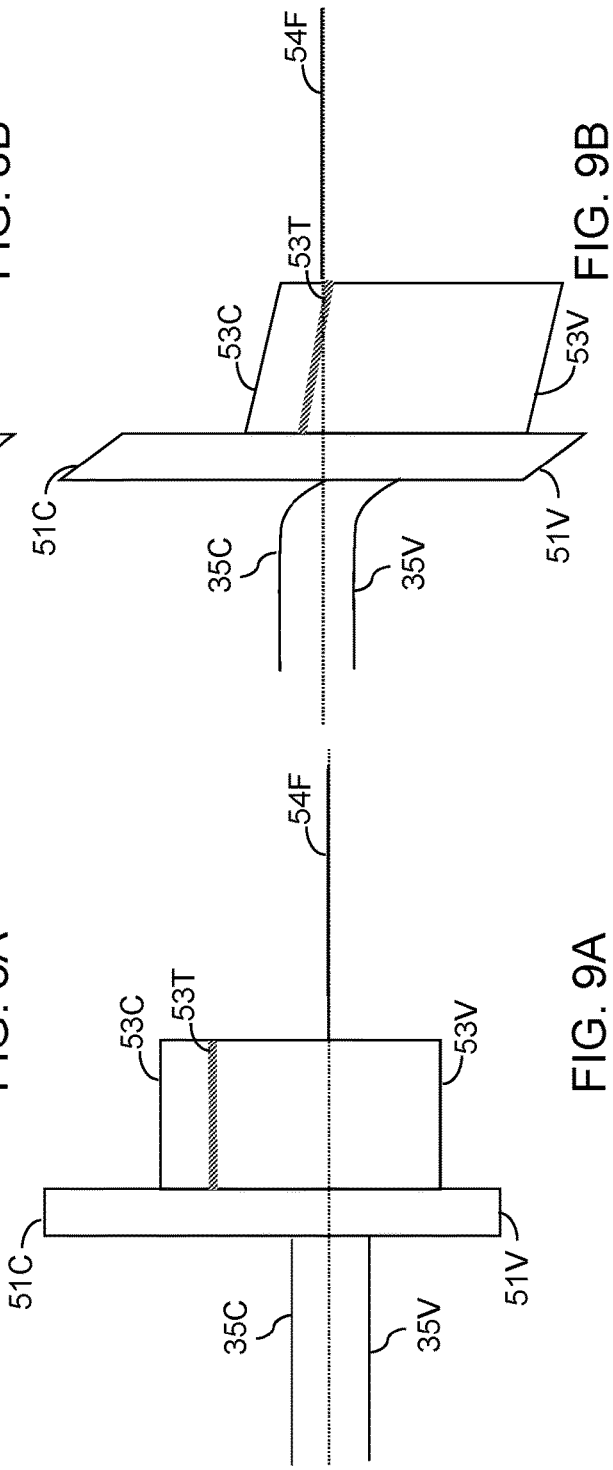

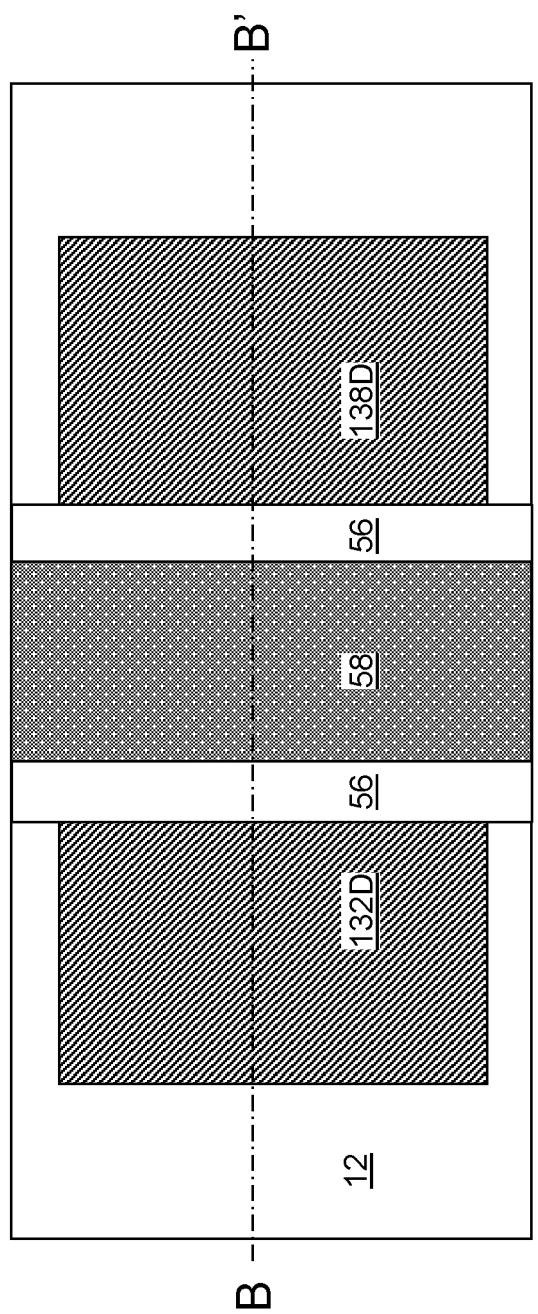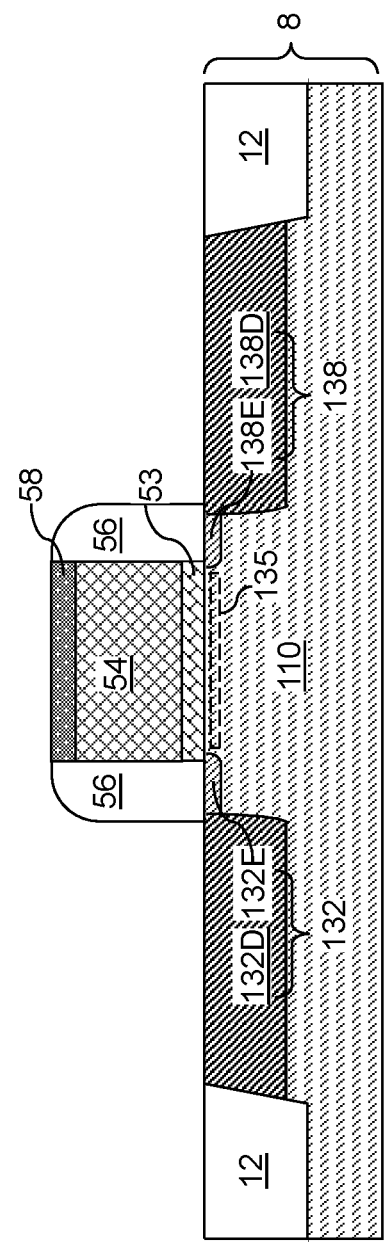
FIG. 13A
FIG. 13B

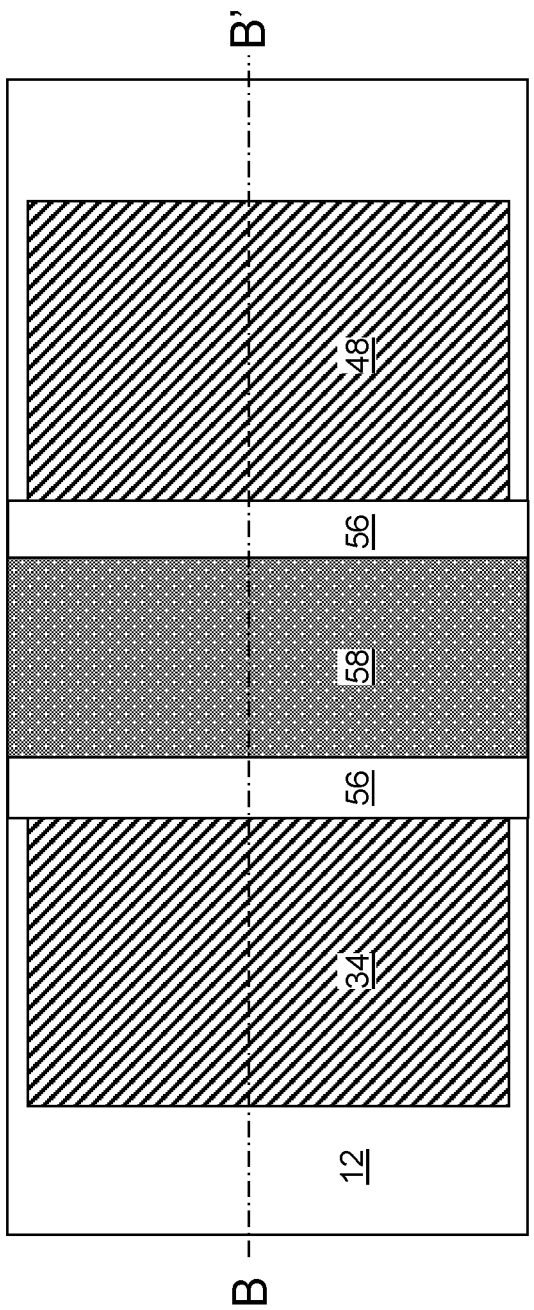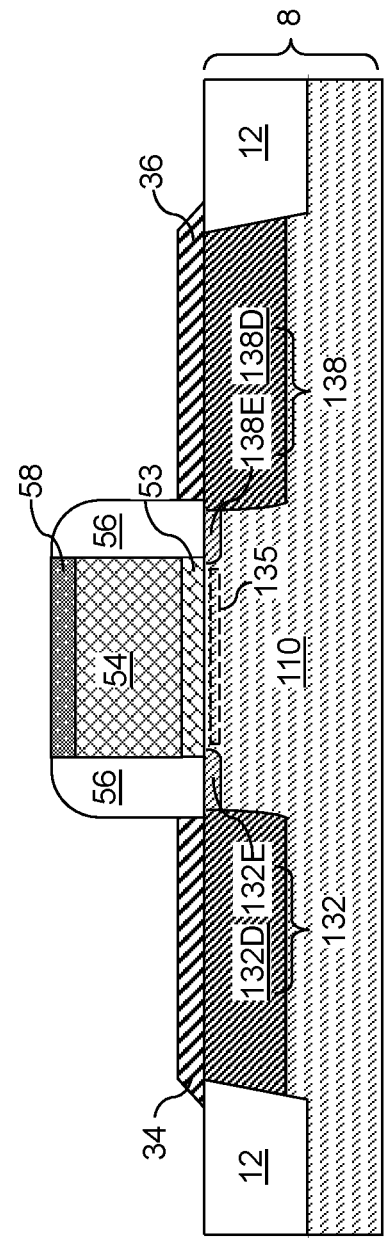

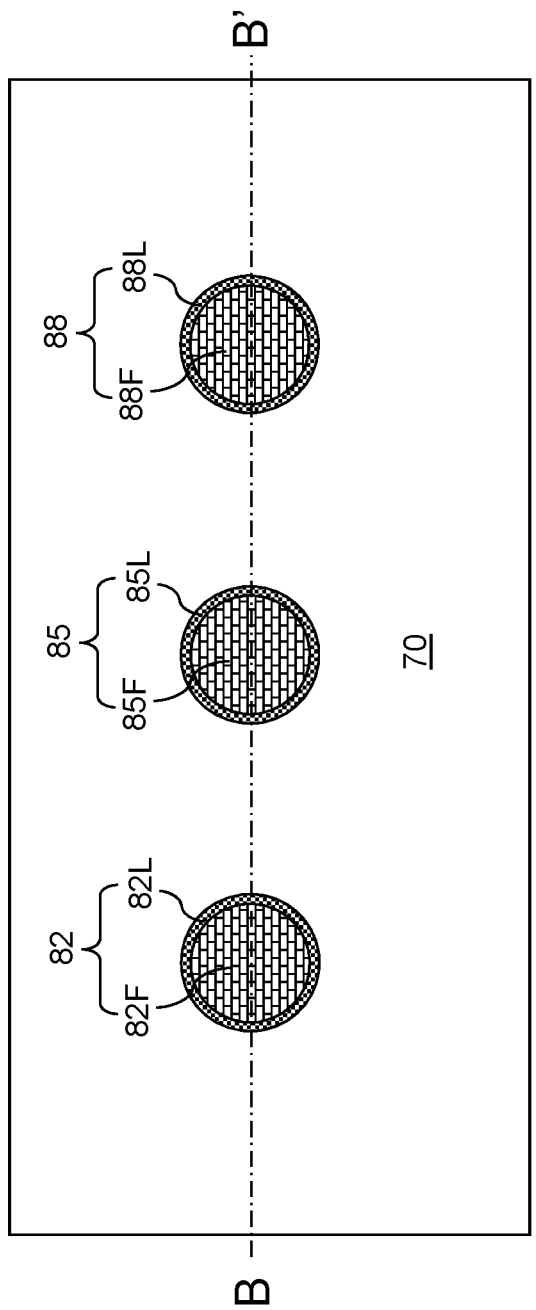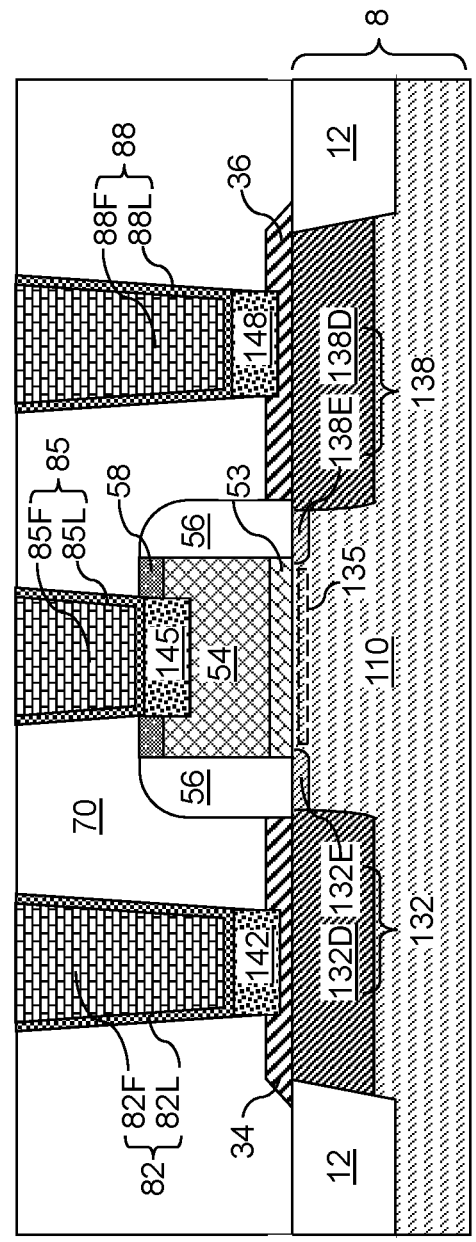
FIG. 16A
FIG. 16B

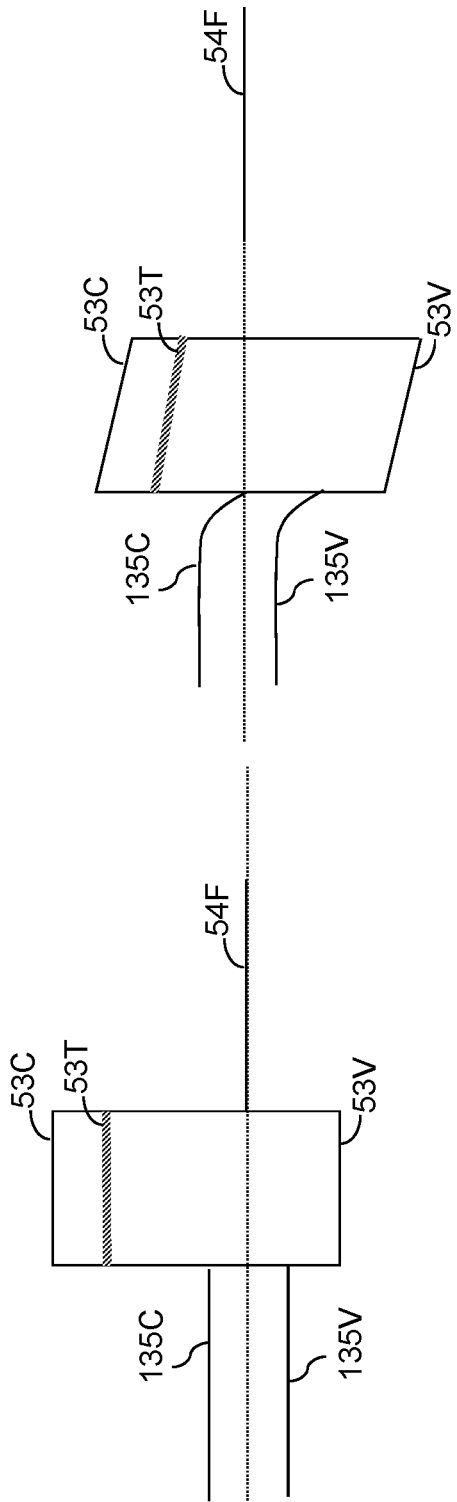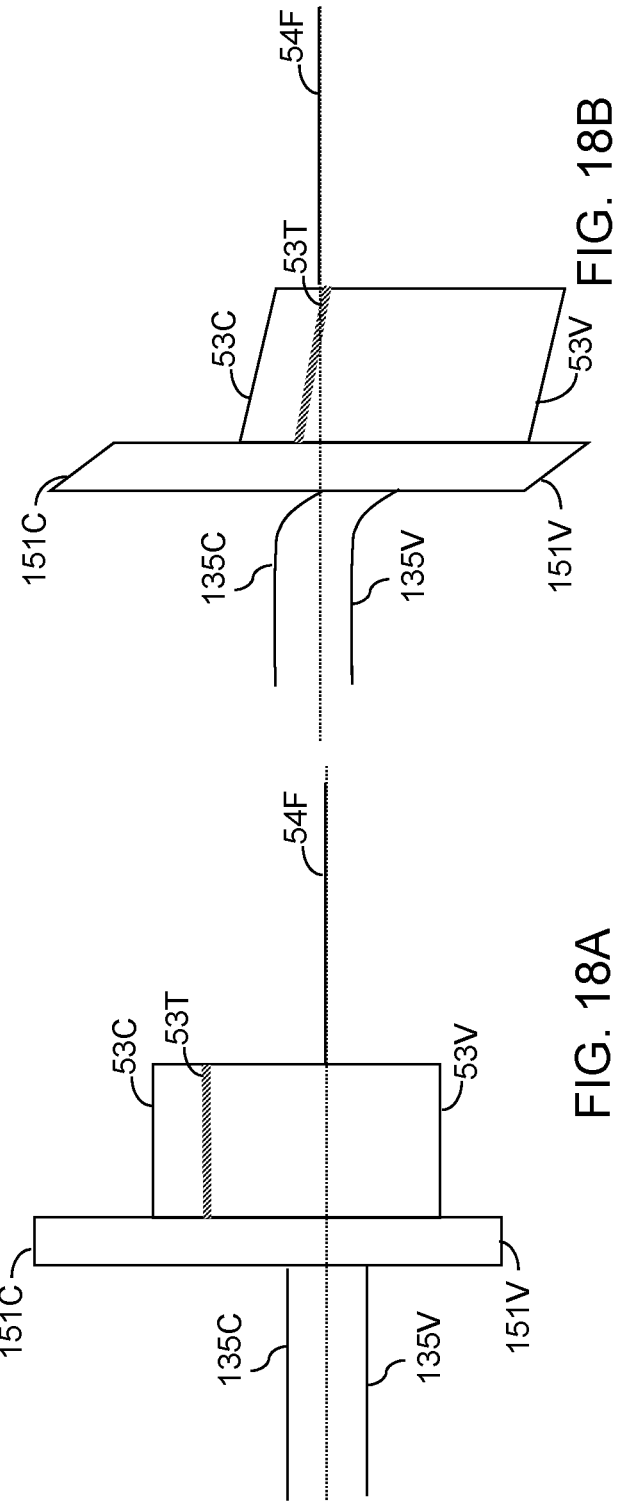

FERROELECTRIC FIELD EFFECT TRANSISTOR USING CHARGE TRAPPING BAND MISALIGNMENT AND METHODS OF FORMING THE SAME

BACKGROUND

A ferroelectric material is a material that may have spontaneous nonzero electrical polarization (i.e., non-zero total electrical dipole moment) when the external electrical field is zero. The spontaneous electrical polarization may be reversed by a strong external electric field applied in the opposite direction. The electrical polarization is dependent not only on the external electrical field at the time of measurement, but also on the history of the external electrical field, and thus, has a hysteresis loop. The maximum of the electrical polarization is referred to as saturation polarization. The electrical polarization that remains after an external electrical field that induces saturation polarization is no longer applied (i.e., turned off) is referred to as remnant polarization. The magnitude of the electrical field that needs to be applied in the opposite direction of the remnant polarization in order to achieve zero polarization is referred to as coercive electrical field. For the purposes of forming memory devices, it is generally desirable to have high remnant polarization and high coercive field. High remnant polarization may increase the magnitude of an electrical signal. High coercive field makes the memory devices more stable against perturbations caused by noise-level electrical field and interferences.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A is a top-down view of the first exemplary structure after formation of a gate stack structure according to the first embodiment of the present disclosure.

FIG. 3B is a vertical cross-sectional view of the first exemplary structure along the plane B-B' of FIG. 3A.

FIG. 4A is a top-down view of the first exemplary structure after formation of a source extension region, a drain extension region, and a gate spacer according to the first embodiment of the present disclosure.

FIG. 4B is a vertical cross-sectional view of the first exemplary structure along the plane B-B' of FIG. 4A.

FIG. 7A is a top-down view of the first exemplary structure after formation of contact via structures according to the first embodiment of the present disclosure.

FIG. 7B is a vertical cross-sectional view of the first exemplary structure along the plane B-B' of FIG. 7A.

FIG. 7C is a circuit schematic of a ferroelectric memory device incorporating the first exemplary structure of FIGS. 7A and 7B.

FIG. 8A is a band diagram of a material stack including the semiconductor channel and the gate stack structure in the field effect transistor in the first exemplary structure when the applied voltage at the gate electrode is zero according to the first embodiment of the present disclosure.

FIG. 8B is a band diagram of a material stack including the semiconductor channel and the gate stack structure in the field effect transistor in the first exemplary structure when the applied voltage at the gate electrode is a positive voltage that turns on the field effect transistor according to the first embodiment of the present disclosure.

FIG. 9A is a band diagram of a comparative exemplary material stack derived from the material stack of FIG. 8A by removal of a charge-trapping-band misalignment layer when the applied voltage at the gate electrode is zero.

FIG. 9B is a band diagram of the comparative exemplary material stack of FIG. 9A when the applied voltage at the gate electrode is a positive voltage that turns on the field effect transistor.

FIG. 13A is a top-down view of the second exemplary structure after formation of a deep source region and a deep drain region according to the second embodiment of the present disclosure.

FIG. 13B is a vertical cross-sectional view of the second exemplary structure along the plane B-B' of FIG. 13A.

FIG. 14A is a top-down view of the second exemplary structure after formation of a raised source region and a raised drain region according to the second embodiment of the present disclosure.

FIG. 14B is a vertical cross-sectional view of the second exemplary structure along the plane B-B' of FIG. 14A.

FIG. 16A is a top-down view of the second exemplary structure after formation of contact via structures according to the second embodiment of the present disclosure.

FIG. 16B is a vertical cross-sectional view of the second exemplary structure along the plane B-B' of FIG. 16A.

FIG. 17A is a band diagram of a material stack including the semiconductor channel and the gate stack structure in the field effect transistor in the second exemplary structure when the applied voltage at the gate electrode is zero according to the second embodiment of the present disclosure.

FIG. 17B is a band diagram of a material stack including the semiconductor channel and the gate stack structure in the field effect transistor in the second exemplary structure when the applied voltage at the gate electrode is a positive voltage that turns on the field effect transistor according to the second embodiment of the present disclosure.

FIG. 18A is a band diagram of a comparative exemplary material stack derived from the material stack of FIG. 17A addition of an interfacial silicon oxide layer when the applied voltage at the gate electrode is zero.

FIG. 18B is a band diagram of the comparative exemplary material stack of FIG. 18A when the applied voltage at the gate electrode is a positive voltage that turns on the field effect transistor.

DETAILED DESCRIPTION

Figure 1A:
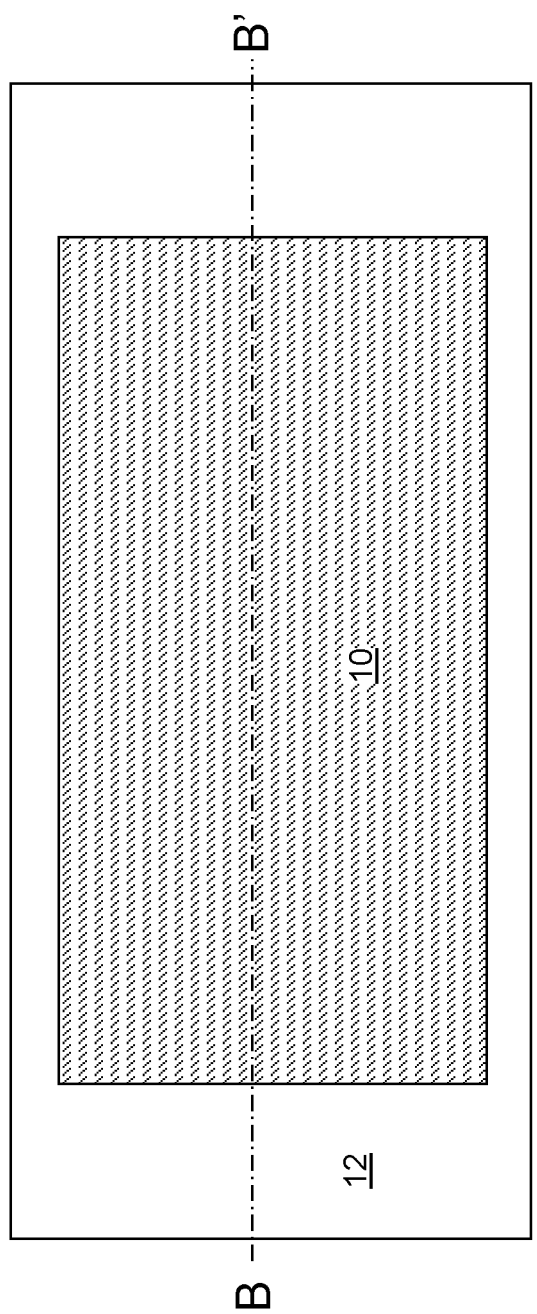
FIG. 1A is a top-down view of a first exemplary structure after formation of a shallow trench isolation structure in an upper portion of a semiconductor substrate according to a first embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to generally to semiconductor devices, and specifically to ferroelectric field effect transistors (FeFETs) having misalignment layer between a conduction band of a semiconductor channel and a charge trapping band of a ferroelectric gate dielectric layer and method of forming the same.

Figure 1B:
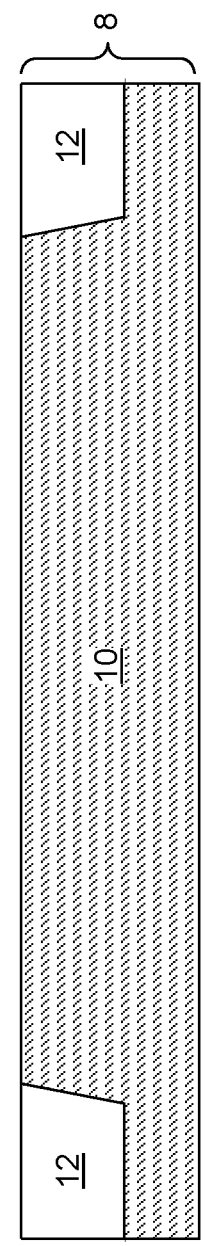
FIG. 1B is a vertical cross-sectional view of the first exemplary structure along the plane B-B' of FIG. 1A.

Referring to FIGS. 1A and 1B, a first exemplary structure according to a first embodiment of the present disclosure is illustrated, which includes a semiconductor substrate 8 including a semiconductor material layer 10. The semiconductor substrate 8 may be a bulk semiconductor substrate in which the semiconductor material layer 10 may extend from a front surface to a backside surface, or may be a semiconductor-on-insulator (SOI) substrate including a buried insulator layer (not shown) underlying the semiconductor material layer 10 and a handle substrate (not shown) that underlies the buried insulator layer. For example, the semiconductor substrate 8 may be a commercially available single crystalline bulk semiconductor substrate or a commercially available semiconductor-on-insulator substrate.

The semiconductor material layer 10 may include a single crystalline semiconductor material or a polycrystalline semiconductor material. In one embodiment, the entirety of the semiconductor material layer 10 may include a single crystalline semiconductor material such as single crystalline silicon. The semiconductor material of the semiconductor material layer 10 may have a doping of a first conductivity type, which may be p-type or n-type. The atomic concentration of dopants of the first conductivity type in the semiconductor material layer 10 may be in a range from $1.0 \times 10^{14}/cm^3$ to $3.0 \times 10^{17}/cm^3$, although lesser and greater atomic concentrations may also be used. In one embodiment, the semiconductor material layer 10 may consist essentially of silicon and dopants of the first conductivity type.

Shallow trench isolation structures 12 may be formed in an upper portion of the semiconductor material layer 10. For example, shallow trenches having a depth in a range from 50 nm to 500 nm may be formed through the top surface of the semiconductor material layer 10 by applying and patterning a photoresist layer over the top surface of the semiconductor material layer 10, and by transferring the pattern in the photoresist layer into the upper portion of the semiconductor material layer 10 using an anisotropic etch process. The photoresist layer may be subsequently removed, for example, by ashing. A dielectric material may be deposited in the shallow trenches, and excess portions of the dielectric may be removed from above the horizontal plane including the top surface of the semiconductor material layer 10 using a planarization process such as a chemical mechanical polishing (CMP) process. The remaining portions of the dielectric material that fill the shallow trenches comprise the shallow trench isolation structures 12. The shallow trench isolation structures 12 may laterally surround device regions, one of which is illustrated in FIGS. 1A and 1B. In one embodiment, each device region may be laterally surrounded by a shallow trench isolation structure 12. While the present disclosure is described using a single device region, it may be understood that multiple device regions laterally surrounded by a respective shallow trench isolation structure 12 may be formed in the first exemplary structure.

Figure 2A:
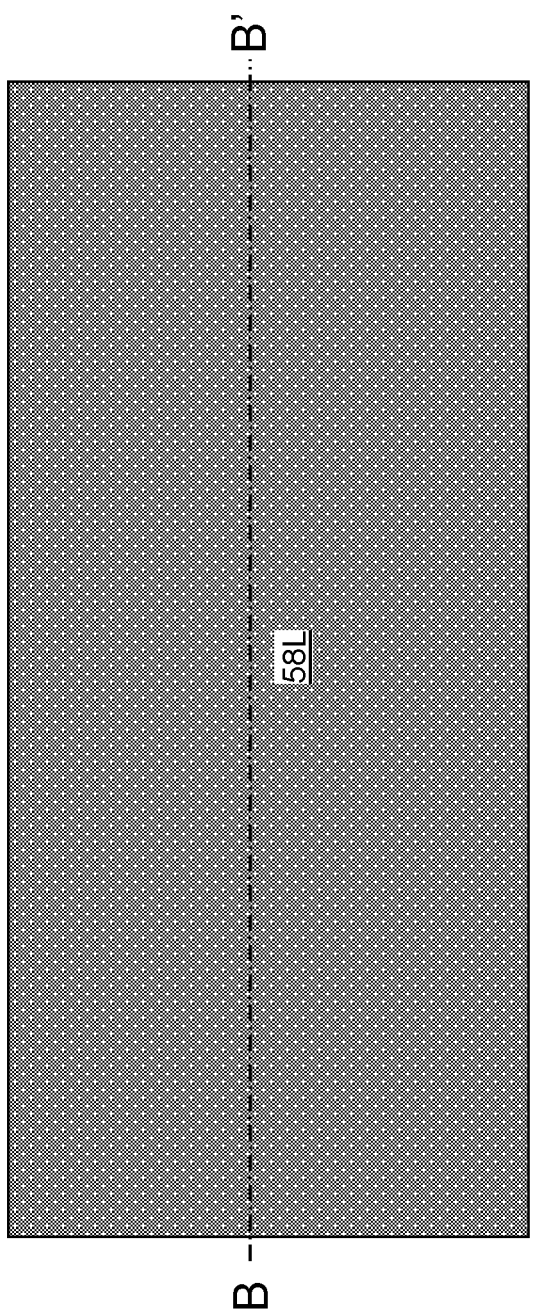
FIG. 2A is a top-down view of the first exemplary structure after deposition of gate stack material layers according to the first embodiment of the present disclosure.
Figure 2B:
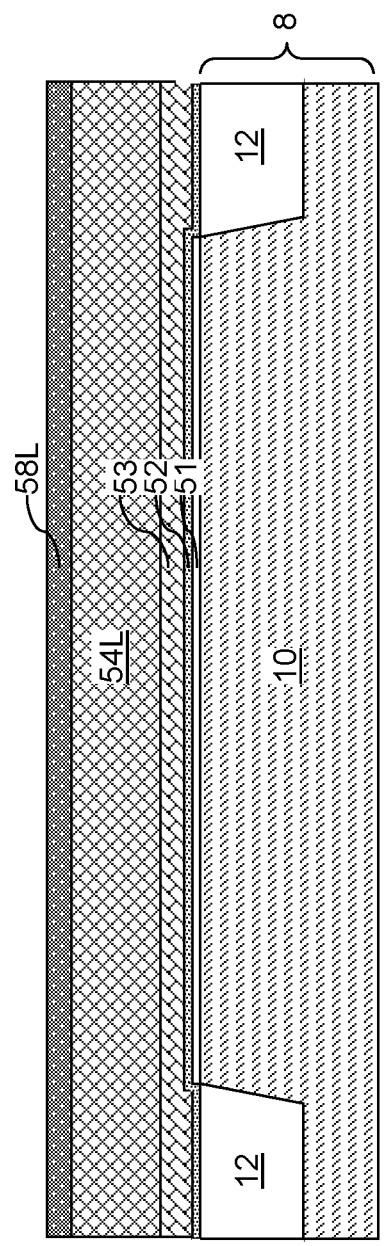
FIG. 2B is a vertical cross-sectional view of the first exemplary structure along the plane B-B' of FIG. 2A.

Referring to FIGS. 2A and 2B, the top surface of the semiconductor material layer 10 may be cleaned to remove impurities. For example, an RCA clean may be performed to remove organic contaminants, particles, surface oxides, and ionic contaminants from the top surface of the semiconductor material layer 10. A wet etch or vapor etch using dilute hydrofluoric acid or hydrofluoric acid vapor may be performed to provide an oxide-free surface as the top surface of the semiconductor material layer 10. Normal exposure to air for a duration longer than 10 minutes generally forms a native oxide layer, which is a surface oxide of the semiconductor material of the semiconductor material layer 10. For example, if the semiconductor material layer 10 includes single crystalline silicon, a surface silicon oxide layer may be formed on the top surface of the semiconductor material layer 10. The surface silicon oxide layer is herein referred to as an interfacial silicon oxide layer 51, and has an effective thickness in a range from 0.1 nm to 0.8 nm. As used herein, the effective thickness of a material layer is the sum of all volumes of the material layer divided by the area of the material layer. If the effective thickness of the interfacial silicon oxide layer 51 may be less than the thickness of one monolayer of silicon oxide (which is about 0.3 nm). In this case, the interfacial silicon oxide layer 51 may be formed as multiple discrete portions or as a continuous layer with multiple holes therethrough. Alternatively, the effective thickness of the interfacial silicon oxide layer 51 may be greater than the thickness of a monolayer of silicon oxide. In this case, the interfacial silicon oxide layer 51 may be formed as a continuous material layer without a hole therethrough.

The thickness of the interfacial silicon oxide layer 51 generally increases with the duration of the exposure time to air. In case the content of oxygen in the ambient air is higher than normal, or in case the temperature of the ambient is above room temperature (i.e., 20 degrees Celsius), the thickness of the interfacial silicon oxide layer 51 may increase. The thickness of the interfacial silicon oxide layer 51 tends to saturate after long exposure to air.

A dielectric metal oxide layer may be formed directly on the interfacial silicon oxide layer 51 by directly depositing a dielectric metal oxide material or by depositing a metal and subsequently oxidizing the metal. Deposition of the dielectric metal oxide material may be performed by an atomic layer deposition process, a chemical vapor deposition process, or a physical vapor deposition process (i.e., a sputtering process). Deposition of a metal may be performed by a physical vapor deposition process (PVD), a chemical vapor deposition (CVD) process, or an atomic layer deposition (ALD) process. Oxidation of the metal may be performed by a plasma oxidation process or a thermal oxidation process at an elevated temperature, which may be in a range from 300 degrees Celsius to 600 degrees Celsius.

According to an embodiment of the present disclosure, the dielectric metal oxide layer includes a dielectric metal oxide material that may shift the band structure of a ferroelectric material to be subsequently deposited thereupon. As such, the dielectric metal oxide material includes a material that is different from the ferroelectric material to be subsequently deposited. A ferroelectric material generally includes a charge trapping band, which is an energy band between the valence band and the conduction band of the ferroelectric material. The charge trapping band may be caused by interfacial charge traps that are inherently present within the ferroelectric material. The dielectric material of the dielectric metal oxide layer may be selected to shift the charge trapping band of the ferroelectric material that may be subsequently formed, and to misalign the charge trapping band of the ferroelectric material from the electronic band of minority charge carriers of the semiconductor material of the semiconductor material layer 10. As such, the dielectric metal oxide layer is herein referred to as a charge-trapping-band misalignment layer 52.

The charge-trapping-band misalignment layer 52 may be formed directly on the interfacial silicon oxide layer 51. In one embodiment, the dielectric metal oxide may comprise, and/or may consist essentially of, an oxide material of at least one elemental metal selected from Be, Mg, Ca, Sr, Ba, Al, Ga, Sc, Y, Ti, V, Cr, Mn, Zr, Nb, Mo, Ta, W, and Lanthanide elements. Other suitable materials may be within the contemplated scope of disclosure. In one embodiment, the dielectric metal oxide may comprise, and/or may consist essentially of, an oxide material of a single elemental metal selected from Be, Mg, Ca, Sr, Ba, Al, Ga, Sc, Y, Ti, V, Cr, Mn, Zr, Nb, Mo, Ta, W, and Lanthanide elements. In one embodiment, the dielectric metal oxide may comprise, and/or may consist essentially of, an oxide material of at least two elemental metals selected from Be, Mg, Ca, Sr, Ba, Al, Ga, Sc, Y, Ti, V, Cr, Mn, Zr, Nb, Mo, Ta, W, and Lanthanide elements. The charge-trapping-band misalignment layer 52 may have an effective thickness in a range from 0.1 nm to 0.5 nm. The dielectric material of the charge-trapping-band misalignment layer 52 induces shifting of the charge trapping band of the ferroelectric material to be subsequently formed relative to a band structure of the semiconductor material upon application of an external electrical field.

A ferroelectric dielectric material may be subsequently deposited directly on the charge-trapping-band misalignment layer 52 to form a ferroelectric material layer, which is used as a component layer of a gate dielectric of a field effect transistor. As such, the deposited ferroelectric material layer is herein referred to as a ferroelectric gate dielectric layer 53. The ferroelectric dielectric material of the ferroelectric gate dielectric layer 53 may be selected from, but are not limited to, $Pb(Zr_xTi_{1-x})O_3$ in which x is in a range from 0 to 1 (i.e., lead zirconate titanate (PZT)), $PbZrO_3$ (PZ), $PbTiO_3$ (PT), $HfO_2$ (i.e., hafnium oxide), $ZrO_2$ (i.e., zirconium oxide), $Hf_xZr_{1-x}O_2$ in which x is between 0 and 1 (i.e., hafnium zirconium oxide), $NH_4H_2PO_4$ (ADP), $KH_2PO_4$ (KDP), $LiNbO_3$ (LN), $LiTaO_3$ (LT), $BaTiO_3$ (BT), $(Pb,La)TiO_3$ (PLT), and $(Pb,La)(Zr,Ti)O_3$, and doped variants thereof. Other suitable materials may be within the contemplated scope of disclosure. The ferroelectric gate dielectric layer 53 may be deposited, for example, by a physical vapor deposition (PVD) process from a sputtering target. The thickness of the ferroelectric gate dielectric layer 53 may be in a range from 3 nm to 20 nm, such as from 4.5 nm to 10 nm, although lesser and greater thicknesses may also be used. The ferroelectric gate dielectric layer 53 may be thick enough to avoid dielectric breakdown during operation of a field effect transistor, and may be thin enough to apply a strong enough electrical field to a semiconductor channel that is formed at the surface of the semiconductor material layer 10.

The ferroelectric gate dielectric layer 53 may have a charge trapping band including electronic states generated by interfacial traps of the ferroelectric dielectric material. The dielectric material of the charge-trapping-band misalignment layer 52 shifts band structure of the ferroelectric dielectric material of the ferroelectric gate dielectric layer 53. Accordingly, the charge trapping band of the ferroelectric dielectric material may be shifted by the dielectric material of the charge-trapping-band misalignment layer 52 relative to a comparative exemplary structure in which the charge-trapping-band misalignment layer 52 is omitted. The charge trapping band of the ferroelectric dielectric material of the ferroelectric gate dielectric layer 53 may be shifted from the electronic band of minority charge carriers of the semiconductor material of the semiconductor material layer 10 along a direction that increases the energy separation between the Fermi level in the semiconductor material layer 10 and the charge trapping band of the ferroelectric dielectric material of the ferroelectric gate dielectric layer 53 during operation of a field effect transistor.

A gate electrode material layer 54L may be subsequently deposited over the ferroelectric gate dielectric layer 53. The gate electrode material layer 54L includes at least one conductive material. For example, the gate electrode material layer 54L may include at least one of a metal, an intermetallic alloy, a metal-semiconductor alloy, a conductive metal oxide, a conductive metal nitride, a conductive metal carbide, and a doped semiconductor material including p-type dopants or n-type dopants at an average atomic concentration in a range from $5.0 \times 10^{19}/cm^3$ to $2.0 \times 10^{21}/cm^3$. The gate electrode material layer 54L may be composed of a single conductive material or a stack of multiple conductive materials. The bottommost material within the gate electrode material layer 54L may be selected to provide a suitable workfunction for the gate electrodes to be subsequently formed by patterning the gate electrode material layer 54L. The gate electrode material layer 54L may be formed by chemical vapor deposition, physical vapor deposition, vacuum evaporation, and/or atomic layer deposition. The thickness of the gate electrode material layer 54L may be in a range from 50 nm to 300 nm, although lesser and greater thicknesses may also be used.

A gate cap dielectric layer 58L may be formed over the gate electrode material layer 54L. The gate cap dielectric layer 58L includes a diffusion barrier material such as silicon nitride. Other suitable materials are within the contemplated scope of the disclosure. The thickness of the gate cap dielectric layer 58L may be in a range from 20 nm to 60 nm, although lesser and greater thicknesses may also be used.

Referring to FIGS. 3A and 3B, a photoresist layer (not shown) may be applied over the gate electrode material layer 54L, and may be lithographically patterned to form line patterns that extend over a respective one of the device regions. An anisotropic etch process (such as a reaction ion etch process) may be performed to transfer the pattern in the photoresist layer through the layer stack of the gate cap dielectric layer 58L, the gate electrode material layer 54L, the ferroelectric gate dielectric layer 53, the charge-trapping-band misalignment layer 52, and the interfacial silicon oxide layer 51. The semiconductor material layer 10 and the shallow trench isolation structures 12 may be used as etch stop structures.

Remaining portions of the layer stack of the gate cap dielectric layer 58L, the gate electrode material layer 54L, the ferroelectric gate dielectric layer 53, the charge-trapping-band misalignment layer 52, and the interfacial silicon oxide layer 51 comprise gate stack structures (51, 52, 53, 54, 58). Each gate stack structure (51, 52, 53, 54, 58) may include, from bottom to top, an interfacial silicon oxide layer 51, a charge-trapping-band misalignment layer 52, a ferroelectric gate dielectric layer 53, a gate electrode 54, and a gate cap dielectric 58. The interfacial silicon oxide layer 51 in each gate stack structure (51, 52, 53, 54, 58) may be a patterned portion of the interfacial silicon oxide layer 51 as formed at the processing steps of FIGS. 2A and 2B. The charge-trapping-band misalignment layer 52 in each gate stack structure (51, 52, 53, 54, 58) may be a patterned portion of the charge-trapping-band misalignment layer 52 as formed at the processing steps of FIGS. 2A and 2B. The ferroelectric gate dielectric layer 53 in each gate stack structure (51, 52, 53, 54, 58) may be a patterned portion of the ferroelectric gate dielectric layer 53 as formed at the processing steps of FIGS. 2A and 2B. The gate electrode 54 in each gate stack structure (51, 52, 53, 54, 58) may be a patterned portion of the gate electrode material layer 54L as formed at the processing steps of FIGS. 2A and 2B. The gate cap dielectric 58 in each gate stack structure (51, 52, 53, 54, 58) may be a patterned portion of the gate cap dielectric layer 58L as formed at the processing steps of FIGS. 2A and 2B.

The sidewalls of each gate stack structure (51, 52, 53, 54, 58) may be vertically coincident with sidewalls of the patterned photoresist layer. In other words, the sidewalls of each gate stack structure (51, 52, 53, 54, 58) may be located within the same vertical planes as the sidewalls of a respective overlying patterned portion of the photoresist layer. In one embodiment, the sidewalls of the interfacial silicon oxide layer 51, the sidewalls of the charge-trapping-band misalignment layer 52, the sidewalls of the ferroelectric gate dielectric layer 53, and the sidewalls of the gate electrode 54 within each gate stack structure (51, 52, 53, 54, 58) may be vertically coincident with one another. The photoresist layer may be subsequently removed, for example, by ashing.

Referring to FIGS. 4A and 4B, an extension ion implantation process may be performed to implant dopants of a second conductivity type into unmasked surface portions of the semiconductor material layer 10. The second conductivity type is the opposite of the first conductivity type. For example, if the first conductivity type is p-type, the second conductivity type is n-type, and vice versa. The implanted surface portions of the semiconductor material layer 10 may be converted into doped semiconductor regions having a doping of the second conductivity type. A source extension region 32E and a drain extension region 38E may be formed within each device region for forming a field effect transistor by conversion of the surface portions of the semiconductor material layer 10 into doped semiconductor material portions having a doping of the second conductivity type. The average atomic concentration of dopants of the second conductivity type in the source extension regions 32E and the drain extension regions 38E may be in a range from $1.0 \times 10^{19}/cm^3$ to $1.0 \times 10^{21}/cm^3$, although lesser and greater dopant concentrations may also be used. The depth of the source extension regions 32E and the drain extension regions 38E may be in a range from 10 nm to 100 nm, although lesser and greater depths may also be used. Each surface portion of the semiconductor material layer 10 that underlies a gate stack structure (51, 52, 53, 54, 58) and is located between a neighboring pair of a source extension region 32E and a drain extension region 38E may comprise a semiconductor channel 35. Each semiconductor channel 35 extends between a source extension region 32E and a drain extension region 38E, and may have a doping of the first conductivity type. Optionally, a halo implantation may be performed to implant dopants of the first conductivity type into regions that underlie the gate stack structures (51, 52, 53, 54, 58).

At least one dielectric material such as silicon nitride and/or silicon oxide may be conformally deposited over the gate stack structures (51, 52, 53, 54, 58), the source extension regions 32E, the drain extension regions 38E, and the shallow trench isolation structures 12. The at least one dielectric material may be anisotropic etched (for example, by a reactive ion etch process) to remove horizontal portions. Each remaining vertical portion that laterally surrounds a respective gate stack structure (51, 52, 53, 54, 58) comprises a gate spacer 56, which includes the at least one dielectric material. While only a single gate spacer 56 is illustrated for a gate stack structure (51, 52, 53, 54, 58), embodiments are expressly contemplated herein in which multiple gate spacers are formed on a gate stack structure (51, 52, 53, 54, 58) by sequentially depositing and anisotropically etching multiple dielectric materials. In one embodiment, a gate spacer 56 may laterally surround a gate stack structure (51, 52, 53, 54, 58), and may be topologically homeomorphic to a torus, i.e., may be continuously deformed into a torus without forming a new opening or destroying an existing opening. The width of each gate spacer 56 at the base portion (i.e., the lateral distance between an inner sidewall and an outer sidewall) may be in a range from 20 nm to 100 nm, although lesser and greater widths may also be used.

Figure 5A:
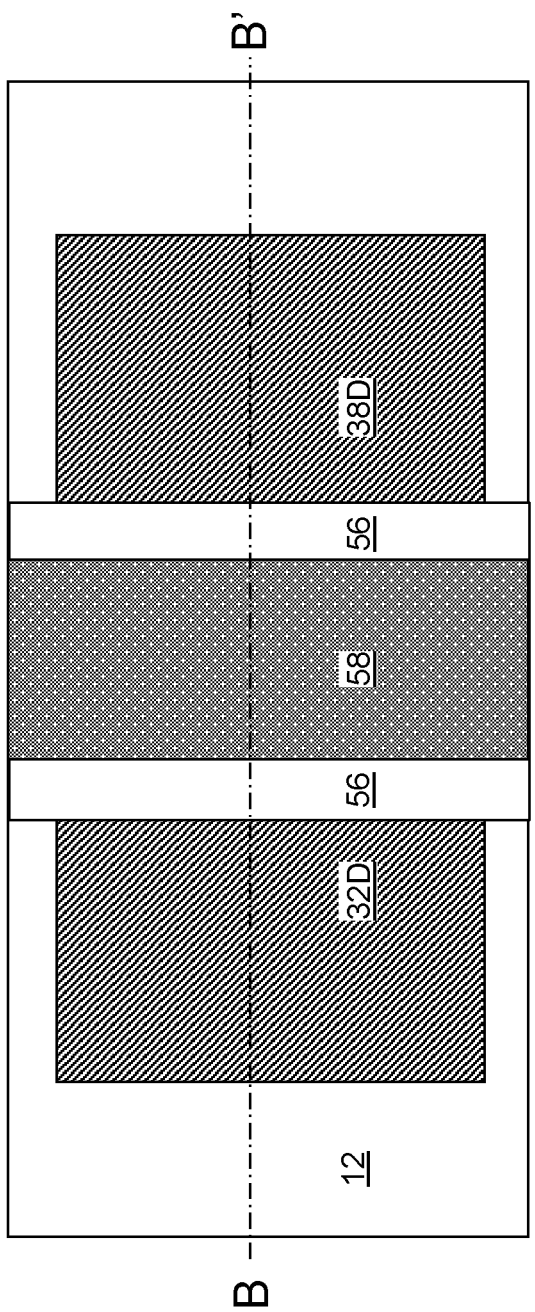
FIG. 5A is a top-down view of the first exemplary structure after formation of a deep source region and a deep drain region according to the first embodiment of the present disclosure.
Figure 5B:
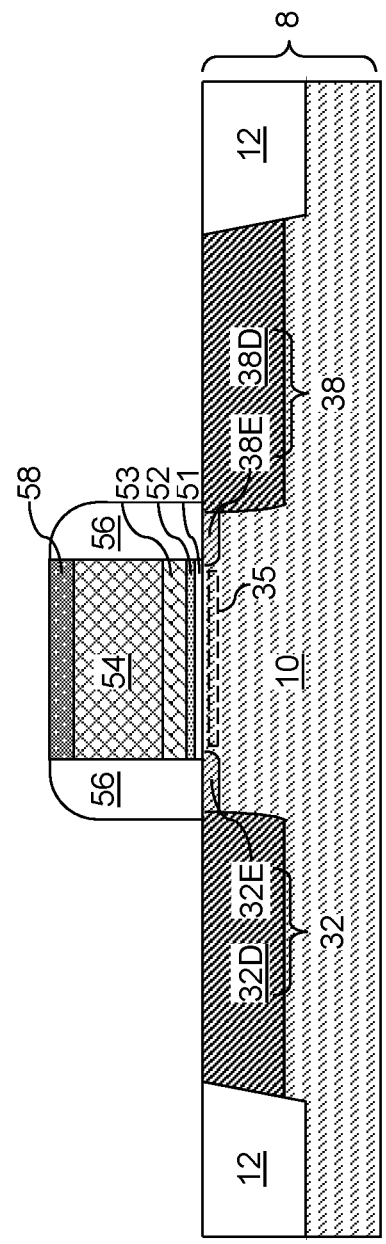
FIG. 5B is a vertical cross-sectional view of the first exemplary structure along the plane B-B' of FIG. 5A.

Referring to FIGS. 5A and 5B, dopants of the second conductivity type may be implanted into unmasked portions of the source extension regions 32E, the drain extension regions 38E, and underlying regions of the semiconductor material layer 10. Implanted portions of the source extension regions 32E, the drain extension regions 38E, and the semiconductor material layer 10 form deep source regions 32D and deep drain regions 38D. The average atomic concentration of dopants of the second conductivity type in the deep source regions 32D and the deep drain regions 38D may be in a range from $5.0\times10^{19}/cm^3$ to $2.0\times10^{21}/cm^3$, although lesser and greater dopant concentrations may also be used. The average atomic concentration of dopants of the second conductivity type in the deep source regions 32D and the deep drain regions 38D is higher than the average atomic concentration of dopants of the second conductivity type in the remaining portions of the source extension regions 32E and the drain extension regions 38E. The depth of the deep source regions 32D and the deep drain regions 38D may be in a range from 40 nm to 300 nm, although lesser and greater depths may also be used. The depth of the deep source regions 32D and the deep drain regions 38D may be greater than the depth of the remaining portions of the source extension regions 32E and the drain extension regions 38E. A deep source region 32D and a deep drain region 38D may be formed within each device region. Each combination of a source extension region 32E and a deep source region 32D constitutes a source region 32. Each combination of a drain extension region 38E and a deep drain region 38D constitutes a drain region 38. Generally, a source region 32 and a drain region 38 may be formed in the semiconductor material of the semiconductor material layer 10 within each device region that is laterally surrounded by a shallow trench isolation structure 12. A semiconductor channel 35 extends between the source region 32 and the drain region 38 underneath a layer stack of a gate stack structure (51, 52, 53, 54, 58).

Figure 6A:
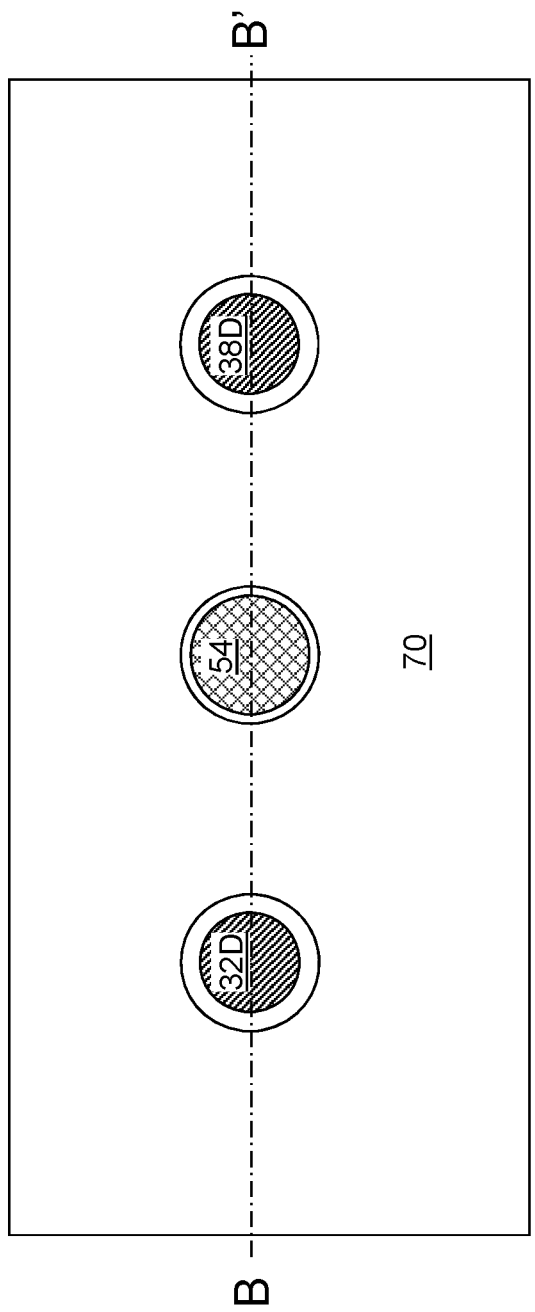
FIG. 6A is a top-down view of the first exemplary structure after formation of a contact-level dielectric layer and contact via cavities according to the first embodiment of the present disclosure.
Figure 6B:
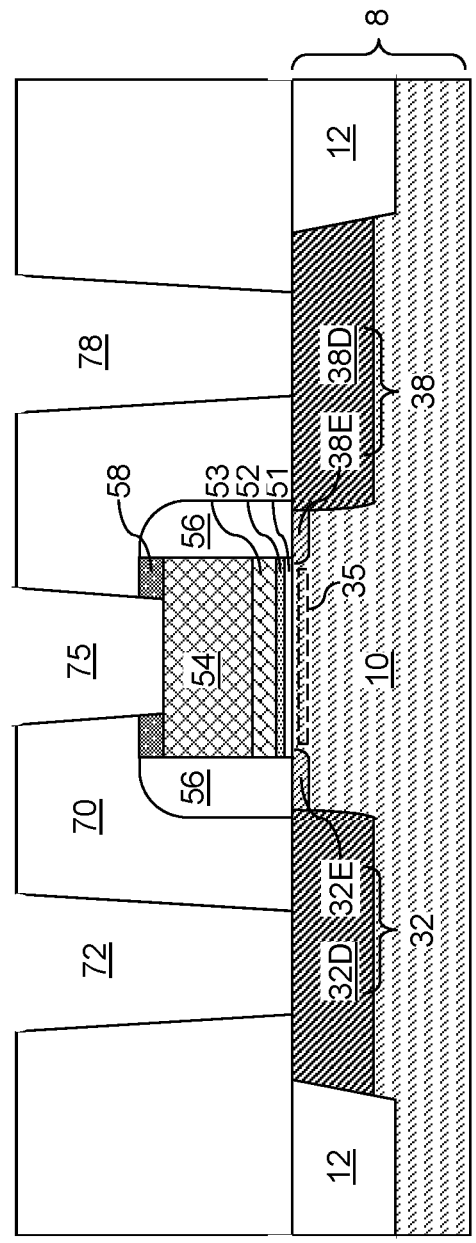
FIG. 6B is a vertical cross-sectional view of the first exemplary structure along the plane B-B' of FIG. 6A.

Referring to FIGS. 6A and 6B, a dielectric material may be deposited over the gate stack structures (51, 52, 53, 54, 58), the source regions 32, the drain regions 38, and the shallow trench isolation structures 12. The dielectric material may include a planarizable dielectric material such as undoped silicate glass or a doped silicate glass, or a self-planarizing dielectric material such as flowable oxide (FOX). The dielectric material may be deposited by a chemical vapor deposition process (such as a plasma-enhanced chemical vapor deposition process) or by spin coating. The top surface of the dielectric material may be planarized during, or after, the deposition process. A dielectric material layer having a planar (i.e., horizontal) top surface is formed, through which contact via structures are subsequently formed. As such, the dielectric material layer is herein referred to as a contact-level dielectric layer 70. The top surface of the contact-level dielectric layer 70 may be planar, and may be located above the top surface of the gate cap dielectrics 58. The vertical distance between the top surface of the contact-level dielectric layer 70 and the top surfaces of the gate cap dielectrics 58 may be in a range from 30 nm to 400 nm, although lesser and greater thicknesses may also be used.

A photoresist layer (not shown) may be applied over the contact-level dielectric layer 70, and may be lithographically patterned to form discrete openings therethrough. The openings in the photoresist layer may be formed over the source regions 32, the drain regions 38, and the gate electrodes 54. An anisotropic etch process may be performed to form contact via cavities (72, 75, 78) through the contact-level dielectric layer 70. The contact via cavities (72, 75, 78) include source contact via cavities 72 that extend from the top surface of the contact-level dielectric layer 70 to a top surface of a respective one of the source regions 32, drain contact via cavities 78 that extend from the top surface of the contact-level dielectric layer 70 to a top surface of a respective one of the drain regions 38, and gate contact via cavities 75 that extend from the top surface of the contact-level dielectric layer 70 to a top surface of a respective one of the gate electrodes 54.

Referring to FIGS. 7A and 7B, a metal that may form a metal-semiconductor alloy may be deposited into the contact via cavities (72, 75, 78) by a conformal or non-conformal deposition method. If the semiconductor material layer 10 comprises, and/or consists essentially of, doped silicon, the metal may be a material that may form a metal silicide. For example, the metal may include nickel, titanium, tungsten, molybdenum, platinum, or another metal that forms a metal silicide. An anneal process may be performed at an elevated temperature to induce formation of a metal silicide material. The elevated temperature may be in a range from 500 degrees Celsius to 750 degrees Celsius. Unreacted portions of the metal may be removed by a wet etch process that etches the metal selective to the metal silicide material. Remaining portions of the metal silicide material include source-side metal-semiconductor alloy regions 42 contacting a respective source region 32, drain-side metal-semiconductor alloy regions 48 contacting a respective drain region 38, and gate-side metal-semiconductor alloy regions 45 contacting a respective gate electrode 54 (in case the topmost material of the gate electrodes 54 prior to the anneal process includes silicon).

A metallic liner including diffusion barrier material may be deposited at peripheral portions of the remaining volumes of the contact via cavities (72, 75, 78). The metallic liner includes a conducive metallic nitride material (such as TiN, TaN, or WN) and/or a metallic carbide material (such as TiC, TaC, or WC). The thickness of the metallic liner may be in a range from 3 nm to 15 nm, although lesser and greater thicknesses may also be used.

A metallic fill material such as Cu, W, Mo, Co, Ru, and/or another elemental metal or an intermetallic alloy may be deposited in remaining volumes of the contact via cavities (72, 75, 78). Portions of the metallic fill material and the metallic liner located above the horizontal plane including the top surface of the contact-level dielectric layer 70 may be removed by a planarization process. Each combination of a remaining portion of the metallic fill material and the metallic liner that fills a respective one of the contact via cavities (72, 75, 78) constitutes a contact via structure (82, 88, 85). The contact via structures (82, 88, 85) include source contact via structures 82 contacting a respective source-side metal-semiconductor alloy region 42, drain contact via structures 88 contacting a respective drain-side metal-semiconductor alloy region 48, and gate contact via structures 85 contacting a respective gate-side metal-semiconductor alloy region 45 or a respective gate electrode 54 (in case gate-side metal-semiconductor alloy regions 45 are not formed). Each source contact via structure 82 includes a source-side metallic liner 82L and a source-side metallic fill material portion 82F. Each drain contact via structure 88 includes a drain-side metallic liner 88L and a drain-side metallic fill material portion 88F. Each gate contact via structure 85 includes a gate-side metallic liner 85L and a gate-side metallic fill material portion 85F. The first exemplary structure includes a ferroelectric field effect transistor that includes a charge-trapping-band misalignment layer 52 as a component of a gate dielectric (51, 52, 53).

In one embodiment, the ferroelectric field effect transistor of FIGS. 7A and 7B may be used to form a ferroelectric memory device. For example, additional devices such as field effect transistors for a gate bias circuit and a sensing circuit may be formed concurrent with formation of the field effect transistor illustrated in FIGS. 2A-7B in the first exemplary structure. Interconnect-level dielectric material layers and metal interconnect structures may be formed over the contact-level dielectric layer 70 to provide electrical interconnections between the various nodes of the field effect transistor illustrated in FIGS. 7A and 7B, the gate bias circuit, and the sensing circuit. FIG. 7C illustrates a circuit schematic of a ferroelectric memory device incorporating the first exemplary structure of FIGS. 7A and 7B. The ferroelectric field effect transistor includes a surface portion of the semiconductor material of the semiconductor material layer 10 as a semiconductor channel 35.

A ferroelectric memory device according to an embodiment of the present disclosure includes the ferroelectric field effect transistor 100 illustrated in FIGS. 7A and 7B, a gate bias circuit 120 configured to provide an on-state and an off-state for the ferroelectric field effect transistor through application of an on-voltage and an off-voltage, respectively, and a sensing circuit 140 configured to measure a direction of electrical polarization in the ferroelectric gate dielectric layer 53 by measuring a magnitude of electrical current between the source region 32 and the drain region 38 while a sensing gate voltage is applied to the gate electrode 54. Generally, the gate electrode 54 may be located on the ferroelectric gate dielectric layer 53, and may be configured to provide an on-state and an off-state for the ferroelectric field effect transistor through application of an on-voltage and an off-voltage, respectively, from the gate bias circuit 120. In an illustrative example, the on-voltage may have a magnitude in a range from 0.5 V to 5 V, and the off-voltage may have a magnitude in a range from 0 V to 0.3 V.

The ferroelectric material of the ferroelectric gate dielectric layer 53 may have a charge trapping band including electronic states generated by interfacial traps of the ferroelectric material. The charge-trapping-band misalignment layer 52 contains a dielectric material that induces shifting of the charge trapping band of the ferroelectric material relative to a band structure of the semiconductor material of the semiconductor material layer 10, which is present in the absence of the external electrical field and upon application of an external electrical field.

Referring to FIGS. 8A, 8B, 9A, and 9B, band diagrams are shown for two material stacks under two different electrical bias conditions. FIG. 8A is a band diagram of a material stack including the semiconductor channel 35 and the gate stack structure (51, 52, 53, 54, 58) less the gate cap dielectric 58 in the field effect transistor in the first exemplary structure of FIGS. 7A and 7B when the applied voltage at the gate electrode 54 (relative to the semiconductor channel 35) is zero (i.e., an off-voltage). FIG. 8B is a band diagram of the material stack of FIG. 8A when the applied voltage at the gate electrode 54 is a positive voltage that turns on the field effect transistor (i.e., an on-voltage). FIG. 9A is a band diagram of a comparative exemplary material stack derived from the material stack of FIG. 8A by removal of a charge-trapping-band misalignment layer 52 when the applied voltage at the gate electrode 54 is zero. In other words, the comparative exemplary material stack consists of, from one side to another, a semiconductor channel 35, an interfacial silicon oxide layer 51, a ferroelectric gate dielectric layer 53, and a gate electrode 54. FIG. 9B is a band diagram of the comparative exemplary material stack of FIG. 9A when the applied voltage at the gate electrode is a positive voltage that turns on the field effect transistor (i.e., the on-voltage). The on-voltage and the off-voltage may be provided, for example, by the gate bias circuit 120.

The various band diagrams illustrate the valence band 35V of the semiconductor channel 35, the conduction band 35C of the semiconductor channel 35, the valence band 51V of the interfacial silicon oxide layer 51, the conduction band 51C of the interfacial silicon oxide layer 51, the valence band 52V of the charge-trapping-band misalignment layer 52, the conduction band 52C of the charge-trapping-band misalignment layer 52, the valence band 53V of the ferroelectric gate dielectric layer 53, the conduction band 53C of the ferroelectric gate dielectric layer 53, the charge trapping band 53T of the ferroelectric gate dielectric layer 53, and the Fermi level 54F within the gate electrode 54 for each electrical bias condition for the combination of a semiconductor channel 35 and a gate stack of the first exemplary structure and for the combination of a semiconductor channel and the comparative exemplary material stack without any charge-trapping-band misalignment layer.

FIG. 9B illustrates that the charge trapping band 53T of the ferroelectric gate dielectric layer 53 is at the same energy level as the Fermi level for the combination of the semiconductor channel and the comparative exemplary material stack without any charge-trapping-band misalignment layer when a ferroelectric field effect transistor is turned on. In contrast, FIG. 8B illustrates that the charge trapping band 53T of the ferroelectric gate dielectric layer 53 is offset from Fermi level for the combination of the semiconductor channel 35 and the gate stack structure (51, 52, 53, 54, 58) less the gate cap dielectric 58 of the present disclosure when the ferroelectric field effect transistor of the first exemplary structure is turned on. Electron trapping in the charge trapping band 53T of the ferroelectric gate dielectric layer 53 during operation of the ferroelectric field effect transistor of the first exemplary structure is avoided by offsetting the energy level of the charge trapping band 53T of the ferroelectric gate dielectric layer 53 from the Fermi level during the on-state of the ferroelectric field effect transistor of the present disclosure.

The slope of the conduction band 52C and the valence band 52V of the charge-trapping-band misalignment layer 52 can be positive or negative depending on the magnitude of the internal electrical field generated by the dipole moments of the material of the charge-trapping-band misalignment layer. Generally, the charge-trapping-band misalignment layer 52 can include a dielectric metal oxide material that has a dipole moment that aligns to the direction of the external electrical field generated by an applied voltage bias across the semiconductor channel 35 and the gate electrode 54. The dipole moment generates an internal electrical field that is antiparallel to the external electrical field. The magnitude of the internal electrical field may be greater than, or less than, the magnitude of the external electrical field. In one embodiment, the slope of the conduction band 52C and the valence band 52V of the charge-trapping-band misalignment layer 52 may be along the opposite direction of the slopes of various bands in neighboring material layers as illustrated in FIG. 8B. The opposite slope of the energy bands (52C, 52V) within the charge-trapping-band misalignment layer 52 can cause the energy level of the charge trapping band 53T of the ferroelectric gate dielectric layer 53 to shift upward away from the Fermi level, thereby providing a greater energy gap between electrons that tunnel through the ferroelectric gate dielectric layer 53 and the energy level of the charge trapping band 53T of the ferroelectric gate dielectric layer 53. In another embodiment, the slope of the conduction band 52C and the valence band 52V of the charge-trapping-band misalignment layer 52 may be along the direction of the slopes of various bands in neighboring material layers. The presence of the charge-trapping-band misalignment layer 52 can induce a greater energy gap between electrons that tunnel through the ferroelectric gate dielectric layer 53 and the energy level of the charge trapping band 53T of the ferroelectric gate dielectric layer 53 compared to the energy gap in the band structure of the comparative exemplary structure illustrated in FIG. 9B, in which a charge-trapping-band misalignment layer is not present.

Generally, the material of the charge-trapping-band misalignment layer 52 may be selected such that the energy level of the charge trapping band 53T during the on-state is offset from the Fermi level. The Fermi level may be close to the energy level of minority charge carriers of the semiconductor channel 35 during the on-state. The energy-level of the minority charge carriers may be the valence band level in case the minority charge carriers are holes, and may be the conduction band level in case the minority charge carriers are electrons. In one embodiment, the material of the charge-trapping-band misalignment layer 52 is selected such that the energy level of the charge trapping band 53T during the on-state is offset from the energy level of minority charge carriers of the semiconductor channel 35.

Figure 10A:
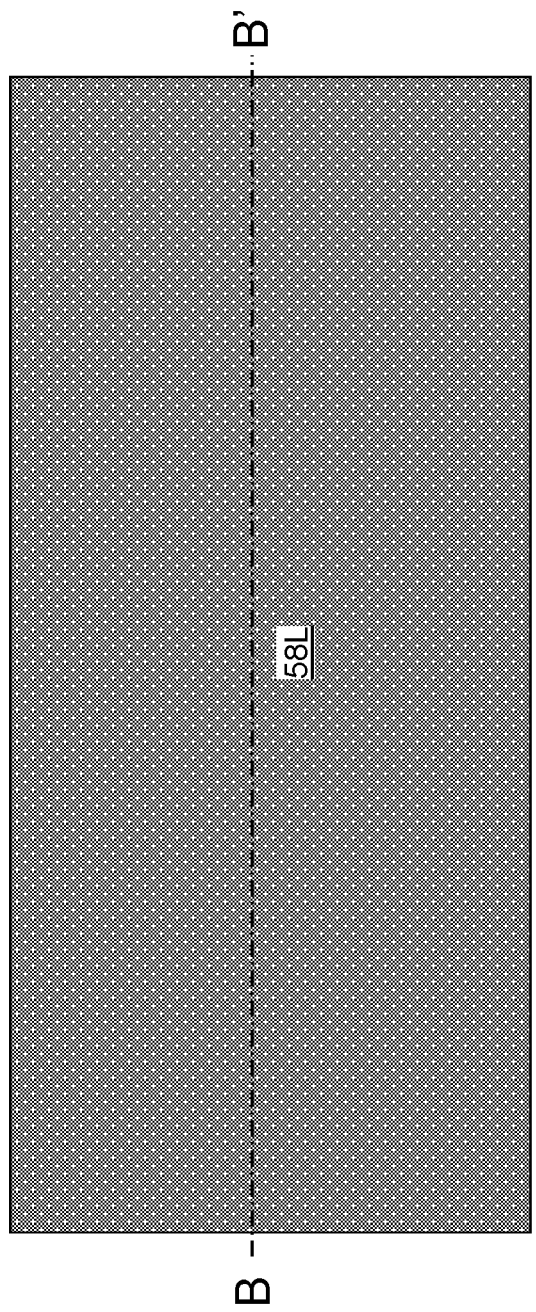
FIG. 10A is a top-down view of a second exemplary structure after deposition of gate stack material layers according to a second embodiment of the present disclosure.
Figure 10B:
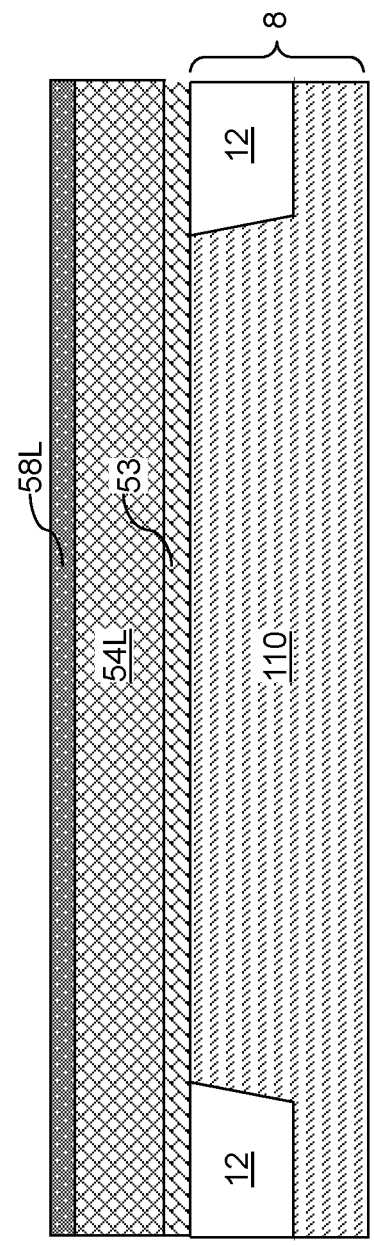
FIG. 10B is a vertical cross-sectional view of the second exemplary structure along the plane B-B' of FIG. 10A.

Referring to FIGS. 10A and 10B, a second exemplary structure according to a second embodiment of the present disclosure may be derived from the first exemplary structure illustrated in FIGS. 2A and 2B by making modifications to the composition of the semiconductor material layer 10 and by omitting formation of the interfacial silicon oxide layer 51 and the charge-trapping-band misalignment layer 52. In the second exemplary structure, a semiconductor material layer 110 including germanium may be used in lieu of the semiconductor material layer 10 of the first embodiment. In one embodiment, the semiconductor material layer 110 includes single crystalline germanium including germanium atoms at an atomic concentration greater than 90%, and/or greater than 95%, and/or greater than 98%, and/or greater than 99%, and/or greater than 99.9%, and/or greater than 99.99%, and/or greater than 99.999%. The semiconductor material layer 110 may have a doping of the first conductivity type, which may be p-type or n-type. In one embodiment, the atomic concentration of the dopants of the first conductivity type in the semiconductor material layer 110 may be in a range from $1.0 \times 10^{14}/cm^3$ to $3.0 \times 10^{17}/cm^3$, although lesser and greater atomic concentrations may also be used.

Thus, the semiconductor substrate 8 may include a doped germanium material portion having a doping of the first conductivity type. The doped germanium material portion may be a single crystalline doped semiconductor material portion as embodied in the semiconductor material layer 110. The semiconductor material layer 110 may be provided as a bulk germanium substrate (such as a germanium wafer), or may be provided as a top semiconductor layer overlying a buried insulating layer in a semiconductor-on-insulator (SOI) substrate. Alternatively, the semiconductor material layer 110 may be formed within a host substrate having a greater lateral dimension than the semiconductor material layer 110. In this case, the semiconductor material layer 110 may be attached to the host substrate by semiconductor-to-semiconductor bonding (for example, through a silicon-germanium alloy layer formed by an anneal of an interfacial region between the semiconductor material layer 110 and a silicon substrate) or by a semiconductor-to-oxide bonding (for example, through a silicon oxide layer or a silicon-germanium oxide layer).

The shallow trench isolation structures 12 may be formed by performing the processing steps of FIGS. 2A and 2B. In one embodiment, silicon nitride liner (not shown) may be formed at the outer periphery of each shallow trench isolation structure 12 to avoid exposure of the germanium material in the semiconductor material layer 110 to the silicon oxide material within the shallow trench isolation structures 12.

The top surface of the semiconductor material layer 110 may be cleaned to remove impurities. The final step of the clean process may include a cleaning step that removes all surface oxide materials from the top surface of the semiconductor material layer 110. For example, an alkaline solution that dissolves germanium oxide may be used to remove surface germanium oxide from the top surface of the semiconductor material layer 110, which is a doped germanium layer. The cleaned semiconductor substrate 8 may be placed in an inert environment such as a transportation pod with nitrogen ambient gas in order to minimize exposure to oxygen and to prevent formation of germanium oxide on the surface of the semiconductor material layer 110. The semiconductor substrate 8 may be loaded into a process chamber through a vacuum loadlock to prevent formation of germanium oxide on the top surface of the semiconductor material layer 110.

According to an embodiment of the present disclosure, a ferroelectric dielectric material may be deposited directly on the top surface of the semiconductor material layer 110 (which may be a single crystalline doped germanium layer) to form a ferroelectric material layer without any interfacial oxide layer between the semiconductor material layer 110 and the ferroelectric material layer. Exposure of the top surface of the semiconductor material layer 110 to oxygen ambient (such as air) may be avoided or minimized during transport of the second exemplary structure from a surface clean tool to the process chamber for deposition of the ferroelectric material layer.

The ferroelectric material layer may be subsequently used as a component layer of a gate dielectric of a field effect transistor. As such, the deposited ferroelectric material layer is herein referred to as a ferroelectric gate dielectric layer 53. The ferroelectric dielectric material of the ferroelectric gate dielectric layer 53 may be any of the materials that may be used for the ferroelectric gate dielectric layer 53 within the first exemplary structure. The thickness of the ferroelectric gate dielectric layer 53 may be within the same range as in the first embodiment, e.g., within a range from 3 nm to 20 nm.

The ferroelectric gate dielectric layer 53 may have a charge trapping band including electronic states generated by interfacial traps of the ferroelectric dielectric material. Elimination of any interfacial oxide material at the interface between the semiconductor material layer 110 and the ferroelectric gate dielectric layer 53 has the effect of shifting the band structure of the ferroelectric dielectric material of the ferroelectric gate dielectric layer 53 relative to a comparative exemplary structure in which an interfacial oxide layer is present at the interface between the semiconductor material layer 110 and the ferroelectric gate dielectric layer. The charge trapping band of the ferroelectric dielectric material of the ferroelectric gate dielectric layer 53 may be shifted from the electronic band of minority charge carriers of the semiconductor material of the semiconductor material layer 10 along a direction that increases the energy separation between the Fermi level in the semiconductor material layer 10 and the charge trapping band of the ferroelectric dielectric material of the ferroelectric gate dielectric layer 53 during operation of a field effect transistor.

A gate electrode material layer 54L may be subsequently deposited over the ferroelectric gate dielectric layer 53. The gate electrode material layer 54L includes at least one conductive material. For example, the gate electrode material layer 54L may include at least one of a metal, an intermetallic alloy, a metal-semiconductor alloy, a conductive metal oxide, a conductive metal nitride, a conductive metal carbide, and a doped semiconductor material including p-type dopants or n-type dopants at an average atomic concentration in a range from $5.0 \times 10^{19}/cm^3$ to $2.0 \times 10^{21}/cm^3$. The gate electrode material layer 54L may be composed of a single conductive material or a stack of multiple conductive materials. The bottommost material within the gate electrode material layer 54L may be selected to provide a suitable workfunction for the gate electrodes to be subsequently formed by patterning the gate electrode material layer 54L. The gate electrode material layer 54L may be formed by chemical vapor deposition, physical vapor deposition, vacuum evaporation, and/or atomic layer deposition. The thickness of the gate electrode material layer 54L may be in a range from 50 nm to 300 nm, although lesser and greater thicknesses may also be used.

A gate cap dielectric layer 58L may be formed over the gate electrode material layer 54L. The gate cap dielectric layer 58L includes a diffusion barrier material such as silicon nitride. The thickness of the gate cap dielectric layer 58L may be in a range from 20 nm to 60 nm, although lesser and greater thicknesses may also be used.

Figure 11A:
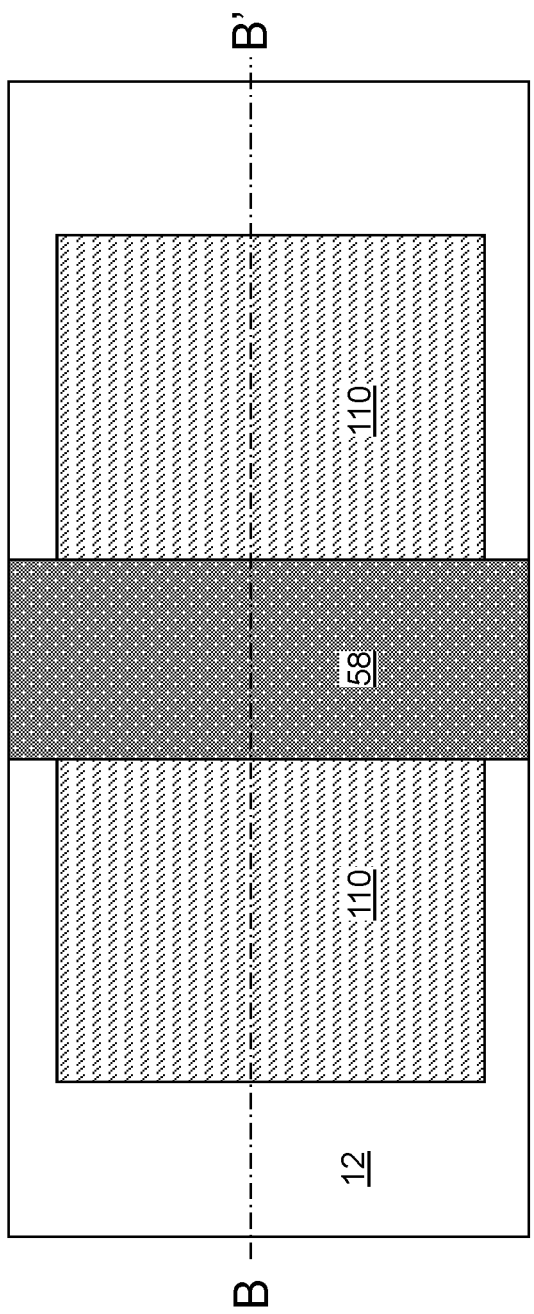
FIG. 11A is a top-down view of the second exemplary structure after formation of a gate stack structure according to the second embodiment of the present disclosure.
Figure 11B:
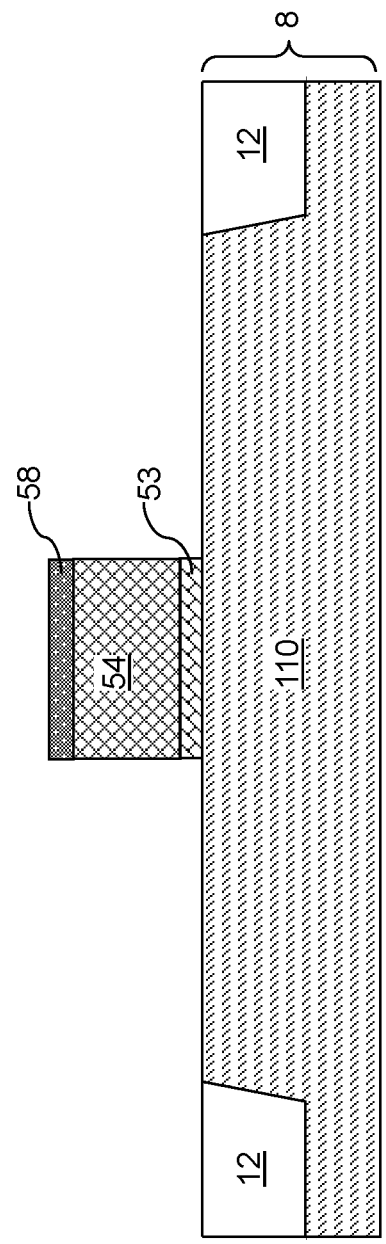
FIG. 11B is a vertical cross-sectional view of the second exemplary structure along the plane B-B' of FIG. 11A.

Referring to FIGS. 11A and 11B, a photoresist layer (not shown) may be applied over the gate electrode material layer 54L, and may be lithographically patterned to form line patterns that extend over a respective one of the device regions. An anisotropic etch process (such as a reaction ion etch process) may be performed to transfer the pattern in the photoresist layer through the layer stack of the gate cap dielectric layer 58L, the gate electrode material layer 54L, and the ferroelectric gate dielectric layer 53. The semiconductor material layer 110 and the shallow trench isolation structures 12 may be used as etch stop structures.

Remaining portions of the layer stack of the gate cap dielectric layer 58L, the gate electrode material layer 54L, and the ferroelectric gate dielectric layer 53 comprise gate stack structures (53, 54, 58). Each gate stack structure (53, 54, 58) may include, from bottom to top, a ferroelectric gate dielectric layer 53, a gate electrode 54, and a gate cap dielectric 58. The ferroelectric gate dielectric layer 53 in each gate stack structure (53, 54, 58) is a patterned portion of the ferroelectric gate dielectric layer 53 as formed at the processing steps of FIGS. 10A and 10B. The gate electrode 54 in each gate stack structure (53, 54, 58) may be a patterned portion of the gate electrode material layer 54L as formed at the processing steps of FIGS. 10A and 10B. The gate cap dielectric 58 in each gate stack structure (53, 54, 58) may be a patterned portion of the gate cap dielectric layer 58L as formed at the processing steps of FIGS. 10A and 10B.

The sidewalls of each gate stack structure (53, 54, 58) may be vertically coincident with sidewalls of the patterned photoresist layer. In other words, the sidewalls of each gate stack structure (53, 54, 58) may be located within the same vertical planes as the sidewalls of a respective overlying patterned portion of the photoresist layer. In one embodiment, the sidewalls of the ferroelectric gate dielectric layer 53 and the sidewalls of the gate electrode 54 within each gate stack structure (53, 54, 58) may be vertically coincident with one another. The photoresist layer may be subsequently removed, for example, by ashing.

Figure 12A:
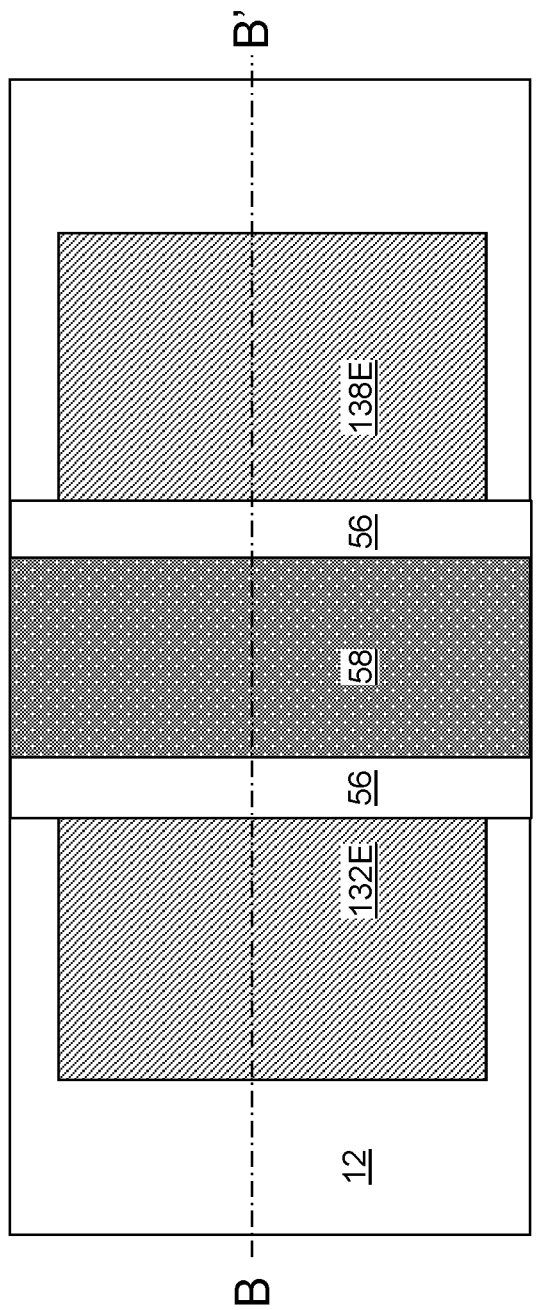
FIG. 12A is a top-down view of the second exemplary structure after formation of a source extension region, a drain extension region, and a gate spacer according to the second embodiment of the present disclosure.
Figure 12B:
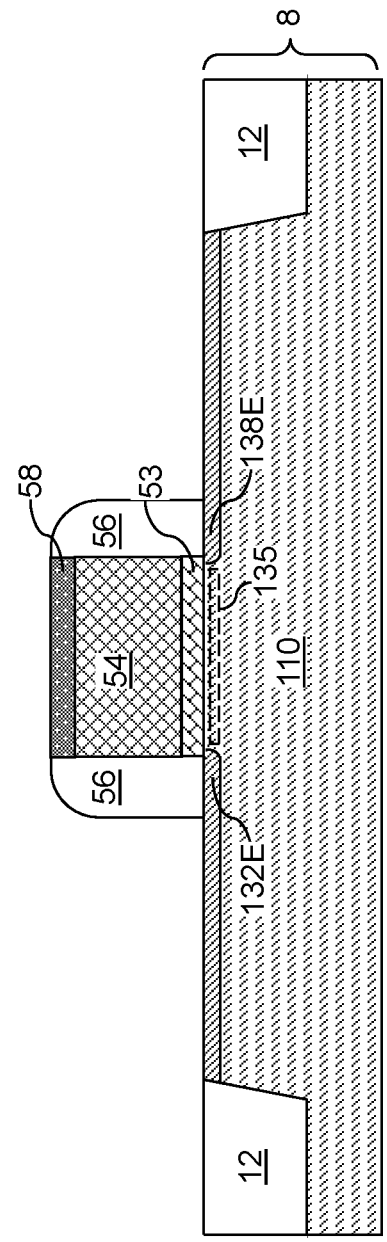
FIG. 12B is a vertical cross-sectional view of the second exemplary structure along the plane B-B' of FIG. 12A.

Referring to FIGS. 12A and 12B, an extension ion implantation process may be performed to implant dopants of a second conductivity type into unmasked surface portions of the semiconductor material layer 110. The second conductivity type is the opposite of the first conductivity type. For example, if the first conductivity type is p-type, the second conductivity type is n-type, and vice versa. The implanted surface portions of the semiconductor material layer 110 are converted into doped semiconductor regions having a doping of the second conductivity type. A source extension region 132E and a drain extension region 138E may be formed within each device region for forming a field effect transistor by conversion of the surface portions of the semiconductor material layer 110 into doped semiconductor material portions having a doping of the second conductivity type. The average atomic concentration of dopants of the second conductivity type in the source extension regions 132E and the drain extension regions 138E may be in a range from $1.0 \times 10^{19}/cm^3$ to $1.0 \times 10^{21}/cm^3$, although lesser and greater dopant concentrations may also be used. The depth of the source extension regions 132E and the drain extension regions 138E may be in a range from 10 nm to 100 nm, although lesser and greater depths may also be used. Each surface portion of the semiconductor material layer 110 that underlies a gate stack structure (53, 54, 58) and is located between a neighboring pair of a source extension region 132E and a drain extension region 138E comprises a semiconductor channel 135. Each semiconductor channel 135 extends between a source extension region 132E and a drain extension region 138E, and has a doping of the first conductivity type. In an alternative embodiment, a halo implantation may be performed to implant dopants of the first conductivity type into regions that underlie the gate stack structures (53, 54, 58).

At least one dielectric material such as silicon nitride and/or silicon oxide may be conformally deposited over the gate stack structures (53, 54, 58), the source extension regions 132E, the drain extension regions 138E, and the shallow trench isolation structures 12. The at least one dielectric material may be anisotropic etched (for example, by a reactive ion etch process) to remove horizontal portions. Each remaining vertical portion that laterally surrounds a respective gate stack structure (53, 54, 58) comprises a gate spacer 56, which includes the at least one dielectric material. While only a single gate spacer 56 is illustrated for a gate stack structure (53, 54, 58), embodiments are expressly contemplated herein in which multiple gate spacers are formed on a gate stack structure (53, 54, 58) by sequentially depositing and anisotropically etching multiple dielectric materials. In one embodiment, a gate spacer 56 may laterally surround a gate stack structure (53, 54, 58), and may be topologically homeomorphic to a torus. The width of each gate spacer 56 at the base portion (i.e., the lateral distance between an inner sidewall and an outer sidewall) may be in a range from 20 nm to 100 nm, although lesser and greater widths may also be used.

Referring to FIGS. 13A and 13B, dopants of the second conductivity type may be implanted into unmasked portions of the source extension regions 132E, the drain extension regions 138E, and underlying regions of the semiconductor material layer 110. Implanted portions of the source extension regions 132E, the drain extension regions 138E, and the semiconductor material layer 110 form deep source regions 132D and deep drain regions 138D. The average atomic concentration of dopants of the second conductivity type in the deep source regions 132D and the deep drain regions 138D may be in a range from $5.0 \times 10^{19}/cm^3$ to $2.0 \times 10^{21}/cm^3$, although lesser and greater dopant concentrations may also be used. The average atomic concentration of dopants of the second conductivity type in the deep source regions 132D and the deep drain regions 138D is higher than the average atomic concentration of dopants of the second conductivity type in the remaining portions of the source extension regions 132E and the drain extension regions 138E. The depth of the deep source regions 132D and the deep drain regions 138D may be in a range from 40 nm to 300 nm, although lesser and greater depths may also be used. The depth of the deep source regions 132D and the deep drain regions 138D may be greater than the depth of the remaining portions of the source extension regions 132E and the drain extension regions 138E. A deep source region 132D and a deep drain region 138D may be formed within each device region. Each combination of a source extension region 132E and a deep source region 132D constitutes a source region 132. Each combination of a drain extension region 138E and a deep drain region 138D constitutes a drain region 138. Generally, a source region 132 and a drain region 138 may be formed in the semiconductor material of the semiconductor material layer 110 within each device region that is laterally surrounded by a shallow trench isolation structure 12. A semiconductor channel 135 extends between the source region 132 and the drain region 38 underneath a layer stack of a gate stack structure (53, 54, 58).

Referring to FIGS. 14A and 14B, raised source regions 34 and raised drain regions 36 may be grown from the physically exposed surfaces of the source regions 32 and the drain regions 38. Generally, germanium is prone to pitting during a wet clean process, and is prone to formation of germanium oxide which is a water-soluble material. Thus, avoiding direct exposure of germanium to a wet etchant or an oxide material is advantageous for the purpose of maintaining the device characteristics for a germanium-containing device. In one embodiment, a selective epitaxy process may be performed to grow a silicon-germanium alloy from each physically exposed semiconductor surface. A selective epitaxy process is a semiconductor deposition process in which a semiconductor precursor and an etchant gas are concurrently or alternately flowed into a process chamber. Semiconductor surfaces provide a shorter incubation time than dielectric surfaces, and deposition rates of a semiconductor material on semiconductor surfaces are higher than deposition rate of the semiconductor material on insulating surfaces. The flow rate of the etchant gas is selected such that net deposition of the semiconductor material occurs on semiconductor surfaces, and net deposition of the semiconductor material does not occur on insulating surfaces in the selective epitaxy process.

Each raised source region 34 may be formed on the top surface of a respective source region 132, and each raised drain region 36 is formed on the top surface of a respective drain region 138. The raised source regions 34 and the raised drain regions 36 may include a silicon-germanium alloy having a doping of the second conductivity type. The atomic concentration of silicon in the silicon-germanium alloy may be uniform, or may decrease with distance from the source regions 132 and the drain regions 138. The average atomic percentage of silicon in the silicon-germanium alloy of the raised source regions 34 and the raised drain regions 36 may be in a range from 25% to 95%. The atomic percentage of silicon atoms at the topmost portions of the raised source regions 34 and the raised drain regions 36 may be in a range from 70% to 99.9%. The dopants of the second conductivity type in the raised source regions 34 and the raised drain regions 36 may be provided in-situ during the selective epitaxy process, or may be provided by an ion implantation process after deposition of an undoped silicon-germanium alloy material. The atomic concentration of the dopants of the second conductivity type in the raised source regions 34 and the raised drain regions 36 may be in a range from $5.0 \times 10^{19}/cm^3$ to $2.0 \times 10^{21}/cm^3$, although lesser and greater atomic concentrations may also be used.

Figure 15A:
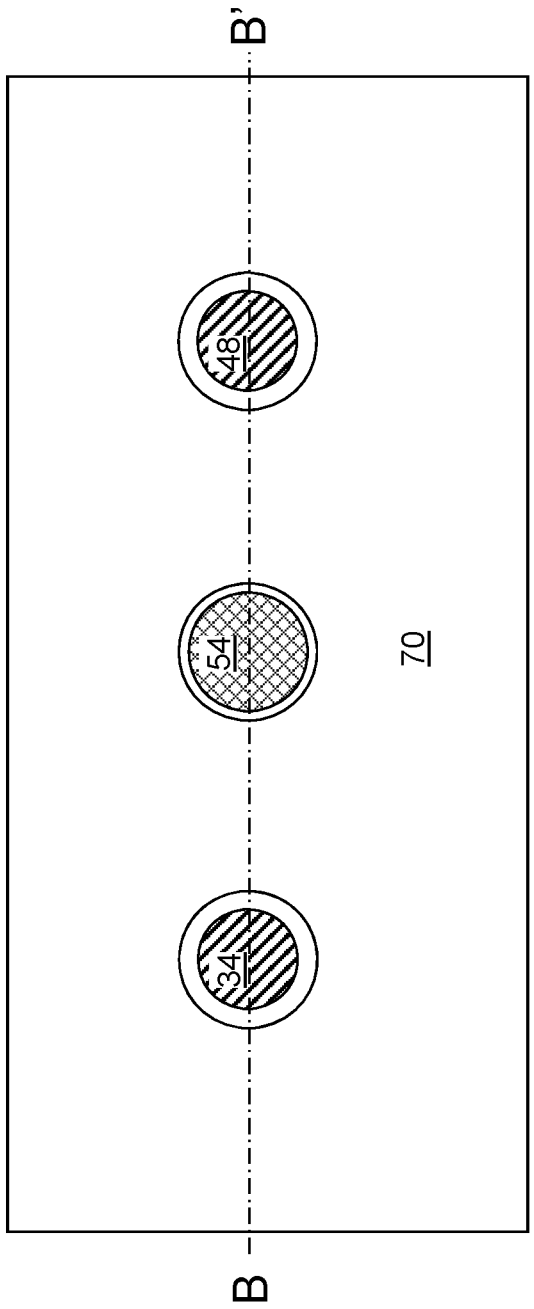
FIG. 15A is a top-down view of the second exemplary structure after formation of a contact-level dielectric layer and contact via cavities according to the second embodiment of the present disclosure.
Figure 15B:
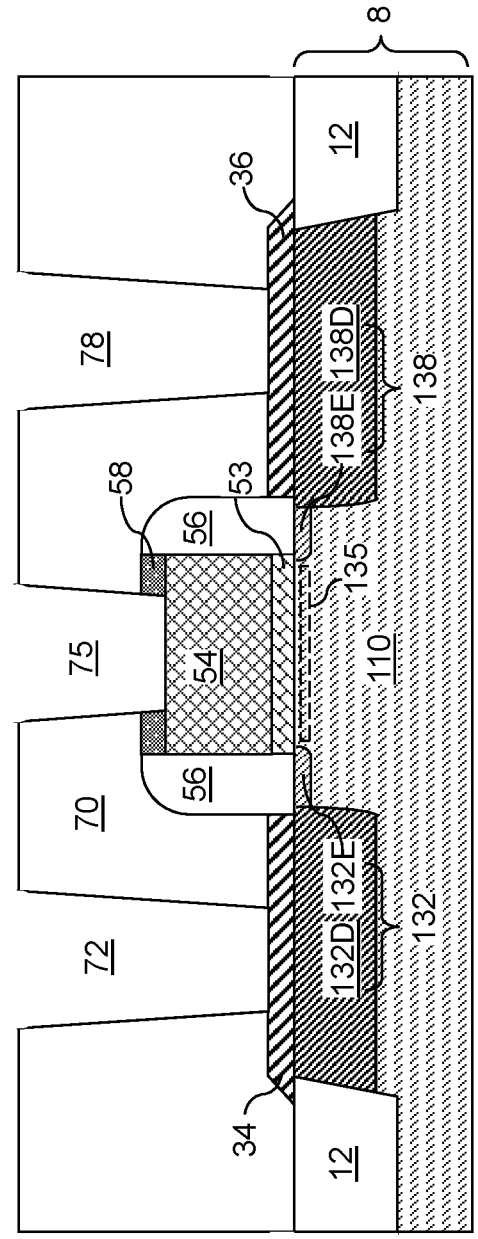
FIG. 15B is a vertical cross-sectional view of the second exemplary structure along the plane B-B' of FIG. 15A.

Referring to FIGS. 15A and 15B, a dielectric material may be deposited over the gate stack structures (53, 54, 58), the raised source regions 34, the raised drain regions 36, and the shallow trench isolation structures 12. The dielectric material may include a planarizable dielectric material such as undoped silicate glass or a doped silicate glass, or a self-planarizing dielectric material such as flowable oxide (FOX). The dielectric material may be deposited by a chemical vapor deposition process (such as a plasma-enhanced chemical vapor deposition process) or by spin coating. The top surface of the dielectric material may be planarized during, or after, the deposition process. A dielectric material layer having a planar (i.e., horizontal) top surface is formed, through which contact via structures are subsequently formed. As such, the dielectric material layer is herein referred to as a contact-level dielectric layer 70. The top surface of the contact-level dielectric layer 70 may be planar, and may be located above the top surface of the gate cap dielectrics 58. The vertical distance between the top surface of the contact-level dielectric layer 70 and the top surfaces of the gate cap dielectrics 58 may be in a range from 30 nm to 400 nm, although lesser and greater thicknesses may also be used.

A photoresist layer (not shown) may be applied over the contact-level dielectric layer 70, and may be lithographically patterned to form discrete openings therethrough. The openings in the photoresist layer may be formed over the raised source regions 34, the raised drain regions 36, and the gate electrodes 54. An anisotropic etch process may be performed to form contact via cavities (72, 75, 78) through the contact-level dielectric layer 70. The contact via cavities (72, 75, 78) include source contact via cavities 72 that extend from the top surface of the contact-level dielectric layer 70 to a top surface of a respective one of the raised source regions 34, drain contact via cavities 78 that extend from the top surface of the contact-level dielectric layer 70 to a top surface of a respective one of the raised drain regions 36, and gate contact via cavities 75 that extend from the top surface of the contact-level dielectric layer 70 to a top surface of a respective one of the gate electrodes 54.

Referring to FIGS. 16A and 16B, a metal that may form a metal-semiconductor alloy may be deposited into the contact via cavities (72, 75, 78) by a conformal or non-conformal deposition method. If the raised source regions 34 and the raised drain regions 36 comprises, and/or consists essentially of, a doped silicon-germanium alloy, the metal may be a material that may form a metal germano-silicide. For example, the metal may include nickel, titanium, tungsten, molybdenum, platinum, or another metal that forms a metal germano-silicide. Other suitable materials are within the contemplated scope of disclosure. An anneal process may be performed at an elevated temperature to induce formation of a metal germano-silicide material over the raised source regions 34 and the raised drain regions 36 and to induce formation of a metal silicide material over the gate electrodes 54 (if the topmost material of the gate electrodes includes silicon). The elevated temperature may be in a range from 500 degrees Celsius to 750 degrees Celsius. Unreacted portions of the metal may be removed by a wet etch process that etches the metal selective to the metal silicide material. Remaining portions of the metal germano-silicide material include source-side metal-semiconductor alloy regions 142 contacting a respective raised source region 34 or a respective source region 132, drain-side metal-semiconductor alloy regions 148 contacting a respective raised drain region 36 or a respective drain region 138, and gate-side metal-semiconductor alloy regions 145 contacting a respective gate electrode 54.

A metallic liner including diffusion barrier material may be deposited at peripheral portions of the remaining volumes of the contact via cavities (72, 75, 78). The metallic liner includes a conducive metallic nitride material (such as TiN, TaN, or WN) and/or a metallic carbide material (such as TiC, TaC, or WC). The thickness of the metallic liner may be in a range from 3 nm to 15 nm, although lesser and greater thicknesses may also be used.

A metallic fill material such as Cu, W, Mo, Co, Ru, and/or another elemental metal or an intermetallic alloy may be deposited in remaining volumes of the contact via cavities (72, 75, 78). Other suitable materials are within the contemplated scope of disclosure. Portions of the metallic fill material and the metallic liner located above the horizontal plane including the top surface of the contact-level dielectric layer 70 may be removed by a planarization process. Each combination of a remaining portion of the metallic fill material and the metallic liner that fills a respective one of the contact via cavities (72, 75, 78) constitutes a contact via structure (82, 88, 85). The contact via structures (82, 88, 85) may include source contact via structures 82 contacting a respective source-side metal-semiconductor alloy region 142, drain contact via structures 88 contacting a respective drain-side metal-semiconductor alloy region 148, and gate contact via structures 85 contacting a respective gate-side metal-semiconductor alloy region 145 or a respective gate electrode 54 (in case gate-side metal-semiconductor alloy regions 145 are not formed). Each source contact via structure 82 includes a source-side metallic liner 82L and a source-side metallic fill material portion 82F. Each drain contact via structure 88 includes a drain-side metallic liner 88L and a drain-side metallic fill material portion 88F. Each gate contact via structure 85 includes a gate-side metallic liner 85L and a gate-side metallic fill material portion 85F.

In the second exemplary structure, the semiconductor channel 135 comprises doped germanium including germanium atoms at an atomic concentration greater than 99% and including dopants of the first conductivity type at an atomic concentration less than 1%. The ferroelectric gate dielectric layer 53 is formed directly on a top surface of the doped germanium material portion without any interfacial material layer between the doped germanium material portion and the ferroelectric gate dielectric layer 53. Thus, the ferroelectric gate dielectric layer 53 is in direct contact with a surface of the semiconductor channel 135 without any interfacial material layer therebetween.

Figure 16C:
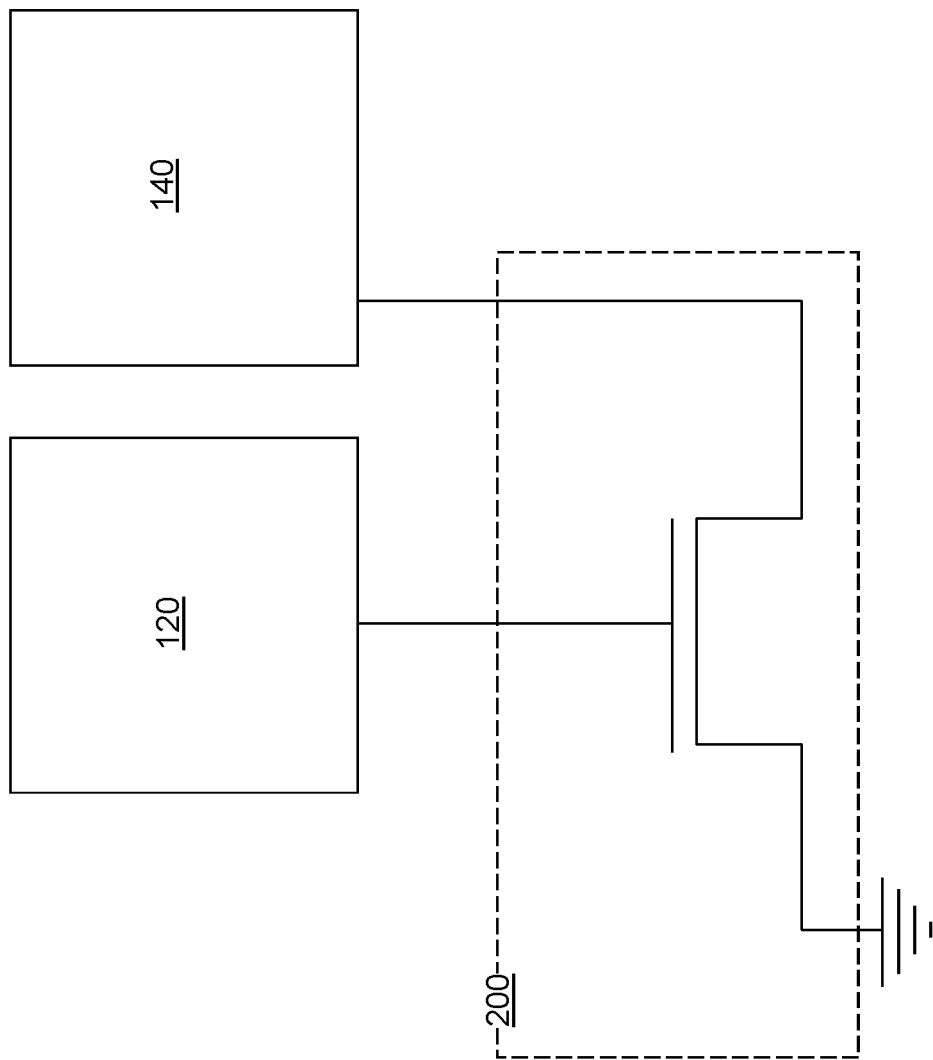
FIG. 16C is a circuit schematic of a ferroelectric memory device incorporating the second exemplary structure of FIGS. 16A and 16B.

In one embodiment, the ferroelectric field effect transistor of FIGS. 16A and 16B may be used to form a ferroelectric memory device. For example, additional devices such as field effect transistors for a gate bias circuit and a sensing circuit may be formed concurrent with formation of the field effect transistor illustrated in FIGS. 10A-16B in the second exemplary structure. Interconnect-level dielectric material layers and metal interconnect structures may be formed over the contact-level dielectric layer 70 to provide electrical interconnections between the various nodes of the field effect transistor illustrated in FIGS. 16A and 16B, the gate bias circuit, and the sensing circuit. FIG. 16C illustrates a circuit schematic of a ferroelectric memory device incorporating the second exemplary structure of FIGS. 16A and 16B. The ferroelectric field effect transistor includes a surface portion of the semiconductor material of the semiconductor material layer 110 as a semiconductor channel 135.

A ferroelectric memory device according to an embodiment of the present disclosure includes the ferroelectric field effect transistor 200 illustrated in FIGS. 16A and 16B, a gate bias circuit 120 configured to provide an on-state and an off-state for the ferroelectric field effect transistor through application of an on-voltage and an off-voltage, respectively, and a sensing circuit 140 configured to measure a direction of electrical polarization in the ferroelectric gate dielectric layer 53 by measuring a magnitude of electrical current between the source region 132 and the drain region 138 while a sensing gate voltage is applied to the gate electrode 54. Generally, the gate electrode 54 may be located on the ferroelectric gate dielectric layer 53, and may be configured to provide an on-state and an off-state for the ferroelectric field effect transistor through application of an on-voltage and an off-voltage, respectively, from the gate bias circuit 120. In an illustrative example, the on-voltage may have a magnitude in a range from 0.5 V to 5 V, and the off-voltage may have a magnitude in a range from 0 V to 0.3 V.

The ferroelectric material of the ferroelectric gate dielectric layer 53 may have a charge trapping band including electronic states generated by interfacial traps of the ferroelectric material. The level of the charge trapping band of the ferroelectric material in the absence of any interfacial material layer between the semiconductor material layer 110 and the ferroelectric gate dielectric layer 53 is shifted relative to a band structure of the semiconductor material of the semiconductor material layer 110, which is present in the absence of the external electrical field and upon application of an external electrical field.

Referring to FIGS. 17A, 17B, 18A, and 18B, band diagrams are shown for two material stacks under two different electrical bias conditions. FIG. 17A is a band diagram of a material stack including the semiconductor channel 135 and the gate stack structure (53, 54, 58) less the gate cap dielectric 58 in the field effect transistor in the second exemplary structure of FIGS. 16A and 16B when the applied voltage at the gate electrode 54 (relative to the semiconductor channel 35) is zero (i.e., an off-voltage). FIG. 17B is a band diagram of the material stack of FIG. 17A when the applied voltage at the gate electrode 54 is a positive voltage that turns on the field effect transistor (i.e., an on-voltage). FIG. 18A is a band diagram of a comparative exemplary material stack derived from the material stack of FIG. 17A by introduction of an interfacial germanium oxide layer when the applied voltage at the gate electrode 54 is zero. In other words, the comparative exemplary material stack consists of, from one side to another, a semiconductor channel 135, an interfacial germanium oxide layer, a ferroelectric gate dielectric layer 53, and a gate electrode 54. FIG. 18B is a band diagram of the comparative exemplary material stack of FIG. 18A when the applied voltage at the gate electrode is a positive voltage that turns on the field effect transistor (i.e., the on-voltage). The on-voltage and the off-voltage may be provided, for example, by the gate bias circuit 120.

The various band diagrams illustrate the valence band 135V of the semiconductor channel 135, the conduction band 135C of the semiconductor channel 135, the valence band 151V of the interfacial germanium oxide layer, the conduction band 151C of the interfacial germanium oxide layer, the valence band 53V of the ferroelectric gate dielectric layer 53, the conduction band 53C of the ferroelectric gate dielectric layer 53, the charge trapping band 53T of the ferroelectric gate dielectric layer 53, and the Fermi level 54F within the gate electrode 54 for each electrical bias condition for the combination of a semiconductor channel 135 and a gate stack of the second exemplary structure and for the combination of a semiconductor channel and the comparative exemplary material stack with an interfacial germanium oxide layer.

FIG. 18B illustrates that the charge trapping band 53T of the ferroelectric gate dielectric layer 53 is at the same energy level as the Fermi level for the combination of the semiconductor channel and the comparative exemplary material stack with an interfacial germanium oxide layer when a ferroelectric field effect transistor is turned on. In contrast, FIG. 17B illustrates that the charge trapping band 53T of the ferroelectric gate dielectric layer 53 is offset from Fermi level for the combination of the semiconductor channel 135 and the gate stack structure (53, 54, 58) less the gate cap dielectric 58 of the present disclosure when the ferroelectric field effect transistor of the second exemplary structure is turned on. Electron trapping in the charge trapping band 53T of the ferroelectric gate dielectric layer 53 during operation of the ferroelectric field effect transistor of the second exemplary structure is avoided by offsetting the energy level of the charge trapping band 53T of the ferroelectric gate dielectric layer 53 from the Fermi level during the on-state of the ferroelectric field effect transistor of the present disclosure.

Generally, the energy level of the charge trapping band 53T during the on-state is offset from the Fermi level. The Fermi level may be close to the energy level of minority charge carriers of the semiconductor channel 135 during the on-state. The energy-level of the minority charge carriers may be the valence band level in case the minority charge carriers are holes, and may be the conduction band level in case the minority charge carriers are electrons. In one embodiment, the energy level of the charge trapping band 53T during the on-state is offset from the energy level of minority charge carriers of the semiconductor channel 135

Figure 19:
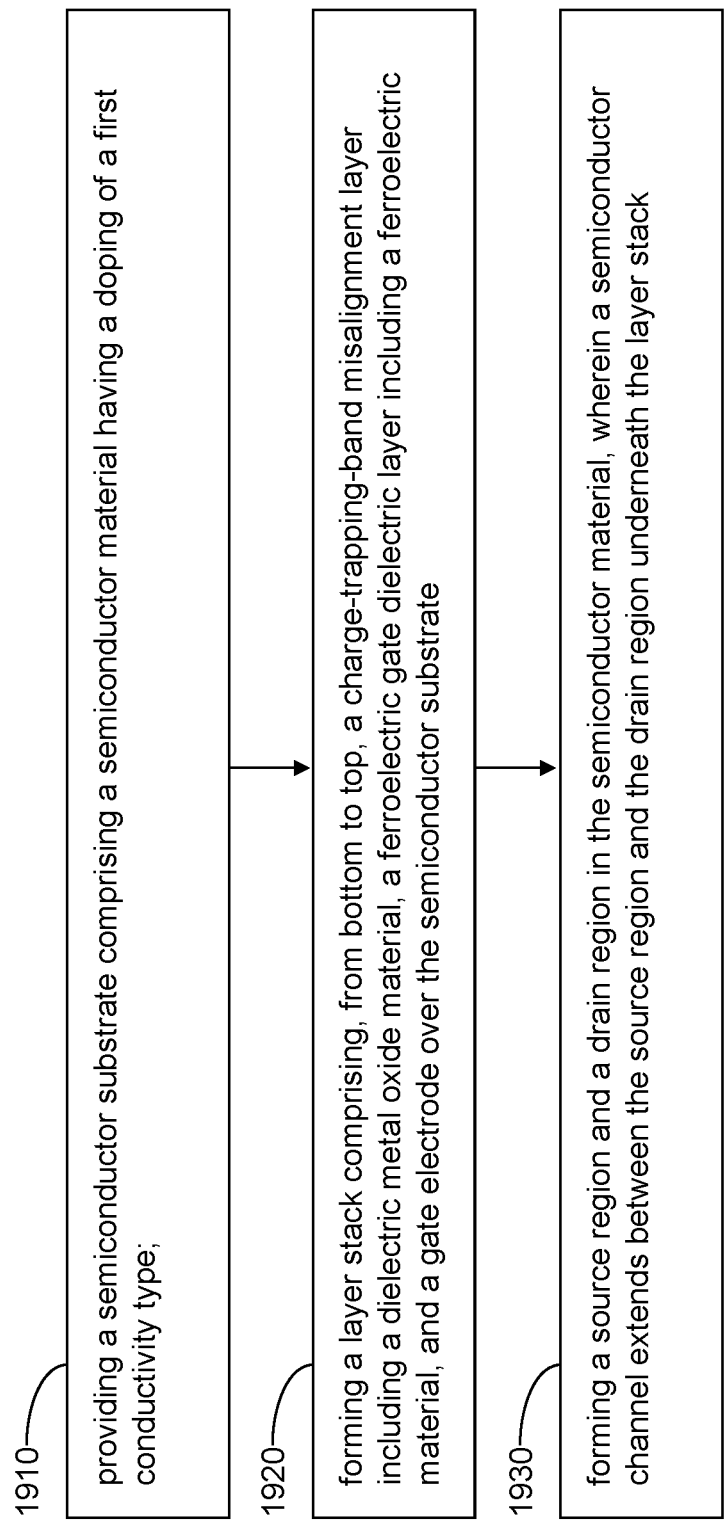
FIG. 19 is a first flowchart illustrating steps for forming the first exemplary structure of the present disclosure according to an embodiment of the present disclosure.

Referring to FIG. 19, a first flowchart illustrates steps for forming the first exemplary structure of the present disclosure. At step 1910, a semiconductor substrate 8 comprising a semiconductor material having a doping of a first conductivity type is provided. At step 1920, a layer stack (51, 52, 53, 54, 58) is formed over the semiconductor substrate 8. The layer stack (51, 52, 53, 54, 58) comprises, from bottom to top, a charge-trapping-band misalignment layer 52 including a dielectric metal oxide material, a ferroelectric gate dielectric layer 53 including a ferroelectric material, and a gate electrode 54. Referring to step 1930, a source region 32 and a drain region 38 are formed in the semiconductor material. A semiconductor channel 35 extends between the source region 32 and the drain region 38 underneath the layer stack (51, 52, 53, 54, 58).

Figure 20:
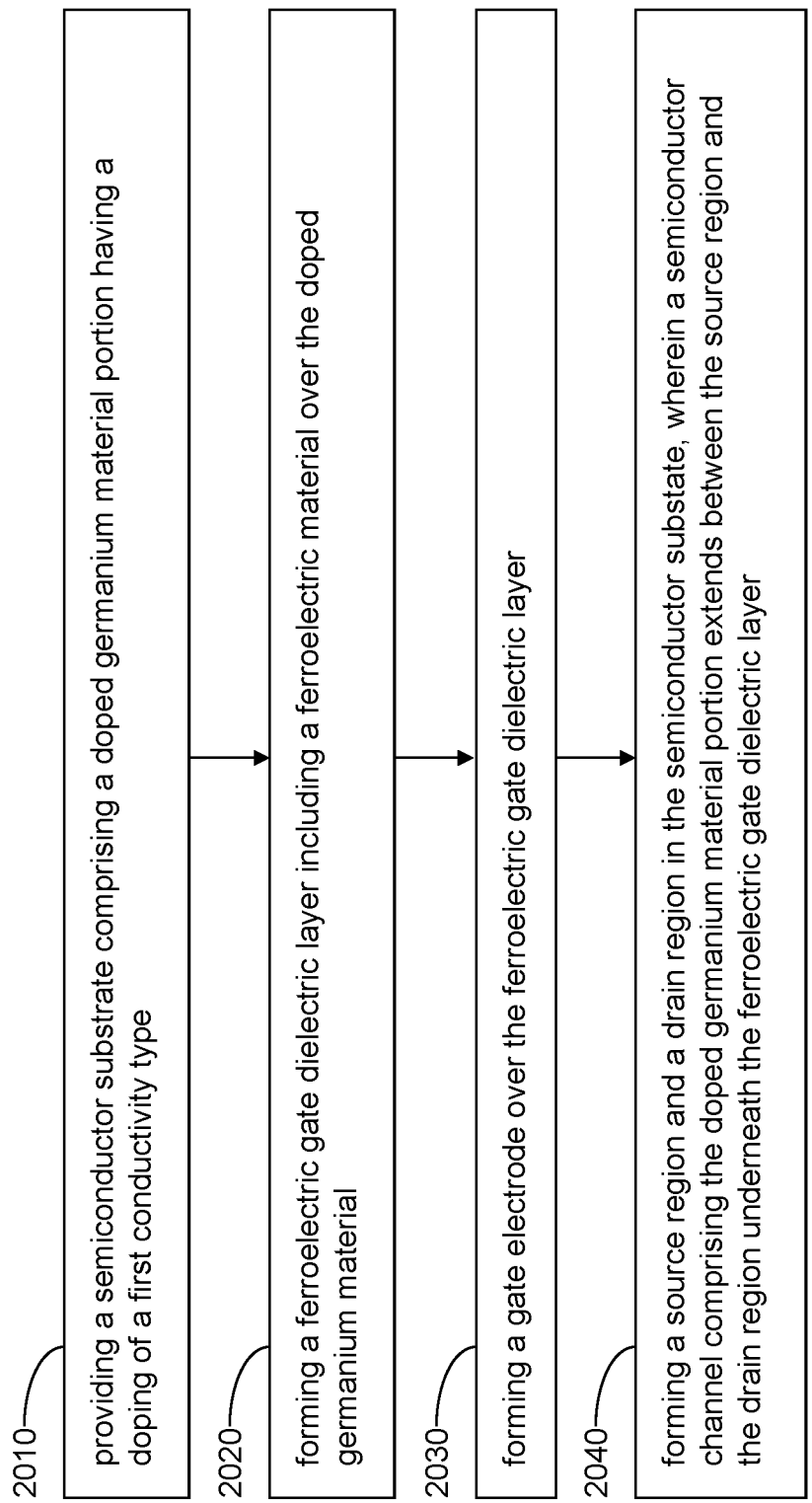
FIG. 20 is a second flowchart illustrating steps for forming the second exemplary structure of the present disclosure according to an embodiment of the present disclosure.

Referring to FIG. 20, a second flowchart illustrates steps for forming the second exemplary structure of the present disclosure. At step 2010, a semiconductor substrate 8 comprising a doped germanium material portion having a doping of a first conductivity type is provided. At step 2020, a ferroelectric gate dielectric layer 53 including a ferroelectric material is formed over the doped germanium material. At step 2030, a gate electrode 54 is formed over the ferroelectric gate dielectric layer 53. At step 2040, a source region 132 and a drain region 138 are formed in the semiconductor substrate 8. A semiconductor channel 135 comprising the doped germanium material portion extends between the source region 132 and the drain region 138 underneath the ferroelectric gate dielectric layer 53.

Referring to all drawings and according to various embodiments of the present disclosure, a ferroelectric field effect transistor is provided, which comprises: a semiconductor substrate 8 comprising a semiconductor channel (35 or 135) that extends between a source region (32 or 132) and a drain region (38 or 138) and having a doping of a first conductivity type; a ferroelectric gate dielectric layer 53 located over the semiconductor channel (35 or 135) and including a ferroelectric material having a charge trapping band 53T including electronic states generated by interfacial traps of the ferroelectric material; and a gate electrode 54 located on the ferroelectric gate dielectric layer 53 and configured to provide an on-state and an off-state for the ferroelectric field effect transistor through application of an on-voltage and an off-voltage, respectively, from a gate bias circuit 120, wherein an energy level of the charge trapping band during the on-state is offset from an energy level of an energy band of minority charge carriers of the semiconductor channel (35 or 135).

In another embodiment, a method of forming a semiconductor structure is disclosed, wherein the method includes the operations of: providing a semiconductor substrate 8 comprising a semiconductor material 10 having a doping of a first conductivity type; forming a layer stack comprising, from bottom to top, a charge-trapping-band misalignment layer 52 including a dielectric metal oxide material, a ferroelectric gate dielectric layer 53 including a ferroelectric material, and a gate electrode 54 over the semiconductor substrate 8; and forming a source region 32 and a drain region 38 in the semiconductor material 10, wherein a semiconductor channel 35 extends between the source region 32 and the drain region 38 underneath the layer stack.

In another embodiment, a method of forming a semiconductor structure is disclosed, wherein the method includes the operations of: providing a semiconductor substrate 8 comprising a semiconductor material layer 110 (which may be a single crystalline doped germanium layer having a doping of a first conductivity type); forming a ferroelectric gate dielectric layer 53 including a ferroelectric material over the semiconductor material layer 110 (which may be a single crystalline doped germanium layer having a doping of a first conductivity type); forming a gate electrode 54 over the ferroelectric gate dielectric layer; and forming a source region 132 and a drain region 138 in the semiconductor substrate 8, wherein a semiconductor channel 135 comprising the doped germanium material portion extends between the source region 132 and the drain region 138 underneath the ferroelectric gate dielectric layer 53.

The various embodiments of the present disclosure provide an energy level offset between the charge trapping band 53T of the ferroelectric gate dielectric layer 53 of a ferroelectric field effect transistor from the Fermi level during operation of the ferroelectric field effect transistor. Because charge carriers (such as electrons) must pass through at energy levels that are different from the energy levels of the charge trapping band 53T of the ferroelectric gate dielectric layer 53, charge trapping in the ferroelectric gate dielectric layer 53 may be avoided. Remnant polarization of the ferroelectric gate dielectric layer 53 does not decrease during usage of the ferroelectric field effect transistor because charge trapping in the charge trapping band 53T of the ferroelectric gate dielectric layer 53 is avoided. Further, saturation polarization of the ferroelectric gate dielectric layer 53 does not decrease during usage of the ferroelectric field effect transistor because charge trapping in the charge trapping band 53T of the ferroelectric gate dielectric layer 53 is avoided. Thus, the ferroelectric field effect transistors of the present disclosure may provide greater endurance than prior art field effect transistors that cause charge trapping in the charge trapping band of a ferroelectric gate dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A ferroelectric field effect transistor comprising:
 a semiconductor substrate comprising a semiconductor channel that extends between a source region and a drain region and having a doping of a first conductivity type;
 a ferroelectric gate dielectric layer located over the semiconductor channel and including a ferroelectric material having a charge trapping band including electronic states generated by interfacial traps of the ferroelectric material; and
 a gate electrode located on the ferroelectric gate dielectric layer and configured to provide an on-state and an off-state for the ferroelectric field effect transistor through application of an on-voltage and an off-voltage, respectively, from a gate bias circuit,
 wherein an energy level of the charge trapping band during the on-state is offset from an energy level of an energy band of minority charge carriers of the semiconductor channel.

2. The ferroelectric field effect transistor of claim 1, further comprising a charge-trapping-band misalignment layer disposed between the ferroelectric gate dielectric layer and the semiconductor channel and containing a dielectric material that induces shifting of the charge trapping band of the ferroelectric material relative to a band structure of the semiconductor channel.

3. The ferroelectric field effect transistor of claim 2, wherein the charge-trapping-band misalignment layer comprises a dielectric metal oxide having an effective thickness in a range from 0.1 nm to 0.5 nm.

4. The ferroelectric field effect transistor of claim 3, wherein the dielectric metal oxide comprises an oxide material of at least one elemental metal selected from Be, Mg, Ca, Sr, Ba, Al, Ga, Sc, Y, Ti, V, Cr, Mn, Zr, Nb, Mo, Ta, W, and Lanthanide elements.

5. The ferroelectric field effect transistor of claim 2, wherein:
 the semiconductor channel comprises silicon; and
 the ferroelectric field effect transistor comprises an interfacial silicon oxide layer located between the semiconductor channel and the charge-trapping-band misalignment layer and comprising silicon oxide and having an effective thickness in a range from 0.1 nm to 0.8 nm.

6. The ferroelectric field effect transistor of claim 5, wherein sidewalls of the interfacial silicon oxide layer, sidewalls of the charge-trapping-band misalignment layer, sidewalls of the ferroelectric gate dielectric layer, and the sidewalls of the gate electrode are vertically coincident with one another.

7. The ferroelectric field effect transistor of claim 1, wherein the semiconductor channel comprises germanium, and the ferroelectric gate dielectric layer is in direct contact with a surface of the semiconductor channel without any interfacial material layer therebetween.

8. The ferroelectric field effect transistor of claim 7, wherein the semiconductor channel comprises doped germanium including germanium atoms at an atomic concentration greater than 99% and including dopants of the first conductivity type at an atomic concentration less than 1%.

9. The ferroelectric field effect transistor of claim 1, wherein the ferroelectric gate dielectric layer comprises a material selected from $Pb(Zr_xTi_{1-x})O_3$ in which x is in a range from 0 to 1, $PbZrO_3$, $PbTiO_3$, $HfO_2$, $ZrO_2$, $Hf_xZr_{1-x}O_2$ in which x is between 0 and 1, $NH_4H_2PO_4$, $KH_2PO_4$, $LiNbO_3$, $LiTaO_3$, $BaTiO_3$, $(Pb,La)TiO_3$, and $(Pb,La)(Zr,Ti)O_3$, and doped variants thereof, and has a thickness in a range from 3 nm to 20 nm.

10. The ferroelectric field effect transistor of claim 1, wherein the gate electrode comprises at least one of a metal, an intermetallic alloy, a metal-semiconductor alloy, a conductive metal oxide, a conductive metal nitride, a conductive metal carbide, and a doped semiconductor material including p-type dopants or n-type dopants at an average atomic concentration in a range from $5.0 \times 10^{19}/cm^3$ to $2.0 \times 10^{21}/cm^3$.

11. The ferroelectric field effect transistor of claim 1, wherein:
 the on-voltage has a magnitude in a range from 0.5 V to 5 V; and
 the off-voltage has a magnitude in a range from 0 V to 0.3 V.

12. A ferroelectric memory device comprising:
 the ferroelectric field effect transistor of claim 1; and
 a sensing circuit configured to measure a direction of electrical polarization in the ferroelectric gate dielectric layer by measuring a magnitude of electrical current between the source region and the drain region while a sensing gate voltage is applied to the gate electrode.

* * * * *